United States Patent [19]

Dasse et al.

[11] Patent Number: 5,594,273
[45] Date of Patent: *Jan. 14, 1997

[54] APPARATUS FOR PERFORMING WAFER-LEVEL TESTING OF INTEGRATED CIRCUITS WHERE TEST PADS LIE WITHIN INTEGRATED CIRCUIT DIE BUT OVERLY NO ACTIVE CIRCUITRY FOR IMPROVED YIELD

[75] Inventors: Edward C. Dasse, Austin; Donald R. Kost, Round Rock; Lawrence J. Day, Manchaca, all of Tex.

[73] Assignee: Motorola Inc., Schaumburg, Ill.

[*] Notice: The term of this patent shall not extend beyond the expiration date of Pat. No. 5,504,369.

[21] Appl. No.: 482,330

[22] Filed: Jun. 7, 1995

Related U.S. Application Data

[60] Continuation-in-part of Ser. No. 342,960, Nov. 21, 1994, Pat. No. 5,504,369, which is a division of Ser. No. 96,094, Jul. 23, 1993, Pat. No. 5,399,505.

[51] Int. Cl.⁶ .............. G01R 31/00; G01R 31/28; H01L 21/66
[52] U.S. Cl. .............. 257/620; 257/48; 257/734; 257/536; 371/21.1; 371/22.5
[58] Field of Search .............. 257/48, 734, 754, 257/213, 202, 204, 786, 620; 371/21.1–21.6

[56] References Cited

U.S. PATENT DOCUMENTS

| | | | |
|---|---|---|---|
| 4,281,449 | 8/1981 | Ports et al. | 29/293 |
| 4,379,259 | 4/1983 | Varadi et al. | 324/73 |
| 4,467,400 | 8/1984 | Stopper | 361/403 |
| 4,472,483 | 9/1984 | Shimamoto et al. | 428/447 |
| 4,489,397 | 12/1984 | Lee | 364/900 |
| 4,518,914 | 5/1985 | Okubo et al. | 324/158 |
| 4,519,035 | 5/1985 | Chamberlain | 364/200 |
| 4,523,144 | 6/1985 | Okubo et al. | 324/158 |
| 4,628,991 | 12/1986 | Hsiao et al. | 165/80.4 |
| 4,783,695 | 11/1988 | Eichelberger et al. | 257/668 |
| 4,849,847 | 7/1989 | McIver et al. | 361/88 |
| 4,855,253 | 8/1989 | Weber | 437/8 |
| 4,884,122 | 11/1989 | Eichelberger et al. | 257/48 |
| 4,918,811 | 4/1990 | Eichelberger et al. | 29/840 |
| 4,937,203 | 6/1990 | Eichelberger et al. | 437/51 |
| 4,956,602 | 9/1990 | Parrish | 324/158 |
| 4,961,053 | 10/1990 | Krug | 324/158 R |
| 4,967,146 | 10/1990 | Morgan et al. | 324/158 |
| 4,968,931 | 11/1990 | Littlebury et al. | 324/158 |
| 5,012,187 | 4/1991 | Littlebury | 324/158 P |
| 5,047,711 | 9/1991 | Smith et al. | 324/158 R |
| 5,059,899 | 10/1991 | Farnworth et al. | 324/138 |
| 5,089,772 | 2/1992 | Hatada et al. | 324/158 |
| 5,130,644 | 7/1992 | Ott | 324/58 F |
| 5,206,181 | 4/1993 | Gross | 437/8 |
| 5,239,191 | 8/1993 | Sakumoto et al. | 257/203 |
| 5,241,266 | 8/1993 | Ahmad et al. | 324/158 R |
| 5,279,975 | 1/1994 | Devereaux et al. | 437/8 |
| 5,294,776 | 3/1994 | Furuyama | 219/209 |
| 5,307,010 | 4/1994 | Chiu | 324/158 R |
| 5,389,556 | 2/1995 | Rostoker et al. | 437/8 |
| 5,399,505 | 3/1995 | Dasse et al. | 437/8 |

OTHER PUBLICATIONS

Intel Corporation, Intel486™ DX Microprocessor Data Book, Jun. 1991, pp. 127–141, Order Number: 240440-004.

*Primary Examiner*—Sara W. Crane
*Assistant Examiner*—Alexander Oscar Williams
*Attorney, Agent, or Firm*—Keith E. Witek

[57] ABSTRACT

Wafer level testing of a wafer (500) is accomplished by dividing the integrated circuits of the wafer into a plurality of segmented bus regions (514, 516, and 518 for example). Each bus region is formed having its own set of test conductors (520–530) wherein each set of test conductors are isolated from all other sets of test conductors on the wafer. Each test conductor has at least one contact pad (531–546) where each contact pad lies within a periphery of the integrated circuits' active areas. By forming pads over ICs and by sub-dividing the bus structure of test conductive lines, more high powered ICs can be tested in a wafer-level manner with fewer problems associated with speed, power, throughput, and routing problems. In addition, all contact pads are formed within the periphery of the ICs but no contact pads are formed over active circuitry so that yield is improved.

14 Claims, 15 Drawing Sheets

APPARATUS FOR PERFORMING WAFER-LEVEL TESTING OF INTEGRATED CIRCUITS WHERE TEST PADS LIE WITHIN INTEGRATED CIRCUIT DIE BUT OVERLY NO ACTIVE CIRCUITRY FOR IMPROVED YIELD

This is a continuation-in-part of application Ser. No. 08/342,960 filed on Nov. 21, 1994, now U.S. Pat. No. 5,504,369, issued Apr. 2, 1996, which is a divisional of application Ser. No. 08/096,094 filed on Jul. 23, 1993, now U.S. Pat. No. 5,399,505, issued Jul. 23, 1994.

FIELD OF THE INVENTION

The present invention relates generally to semiconductor testing, and more particularly, to wafer-level burn-in and testing of semiconductor wafers.

BACKGROUND OF THE INVENTION

Semiconductor manufacturers have the cost saving goal of detecting and screening out defective integrated circuits (ICs) as early as possible in the manufacturing process. In addition, the requirement of supplying "known good die" to multi-chip module (MCM) manufacturers has increased the importance of this goal. In addition, many manufactured ICs will operationally fail within a first few months or weeks of use due to processing defects. This early failure is known as infant mortality. Typically, customers do not desire to receive a product that will simply fail in a short period of time and therefore high temperature testing can be performed on ICs for extended periods of time and before shipping to ferret out infant mortality product before shipping product to a customer.

During a typical semiconductor manufacturing process, a plurality of integrated circuits are formed as individual die on a semiconductor wafer. At present, each semiconductor wafer generally has dozens to hundreds of individual die formed thereon in some two-dimensional pattern (usually a row/column approach). As integration geometries decrease and the size of semiconductor wafers increase, the number of integrated circuit die formed on each wafer is will increase.

Once the die are formed on the semiconductor wafer, the die are then tested to determine which die are functional and which die are not functional. In most testing procedures, each die is probed using very cosily probe equipment while the die are still in wafer form. The presently available probe equipment is capable of only testing one or a few die at a time, and does not catch infant mortality but only functionally failing parts (infant mortality parts are sure to fail at a soon-to-come later time). The presently available probe equipment contacts each bonding pad on an individual die with a separate probe needle.

Typically probe testing requires that each die is probed in order to determine whether each die passes a very basic opens/shorts test (e.g. a test for electrical opens or electrical shorts). In most cases, a full functional test is also performed using the probe equipment to ensure that an adder adds, that a memory stores, etc. However, no reliability testing (testing projected failure of part over time which includes infant mortality) is performed because it would be too cosily to tie up the probe equipment testing one or a few die at a time for the many hours required for reliability testing.

The purpose of the wafer level probe test is to determine, as early as possible in the manufacturing process, whether each individual die is defective or not. The earlier a defective die is detected, the less money that is wasted on further processing of defective die. Bad die are marked via ink or are retained via a computer program to ensure that these bad die are discarded.

The die are then separated or singulated (via a scribe line dicing process) into individual die using any one of a variety of singulation techniques. In most cases, each good die is then packaged in an integrated circuit package. Once the die have been packaged, thorough electrical testing is performed on each of the packaged integrated circuits. The purpose of the thorough electrical testing is to determine whether each packaged integrated circuit properly performs the functionality specified by the semiconductor manufacturer. The tested, packaged integrated circuits are then sold.

In some cases, the packaged integrated circuits also undergo a reliability testing procedure called burn-in. Burn-in testing involves the testing of an integrated circuit for an extended period of time while the temperature of the integrated circuit is elevated above room temperature. This test method finds infant mortality failures. In some cases, the heat generated by the integrated circuit itself is sufficient to elevate the temperature of the integrated circuit. In other cases, the temperature of the integrated circuit is raised by an apparatus external to the integrated circuit (e.g. a burn-in oven in which the packaged integrated circuits are placed).

Alternately, instead of or in addition to burn-in testing, cold temperature reliability testing may be performed. Cold temperature reliability testing involves the testing of an integrated circuit for an extended period of time while the temperature of the integrated circuit is decreased below room temperature. Therefore, reliability testing is performed to not only ensure functionality of the die, but ensure that the die can survive reasonable changes in environment and operation over extended periods of time.

Typically, the die can be burn-in tested on a die-by-die basis after packaging, or can be burned-in on a wafer-level basis (i.e., all die on the wafer are burned-in in parallel). To burn in all ICs in parallel on a wafer, a top level of conductive material is placed on the wafer with contact areas for the top layer being formed over areas not occupied by IC die (therefore, the area of the wafer is increased or special processing is needed to place the top level of conductive material in a place where no other structures lie on the wafer). The top level of conductive material is routed to all the tens or hundreds of ICs on the wafer, which in many cases can create high current requirements since modern ICs can dissipate 1–50 Watts of power easily. The high power requires that the top layer of metal be thick and/or wide to provide for the potentially large current draw. Therefore, the top layer of metal for current wafer burn-in is constrained by current limitations and requires special processing to form (this special processing being cosily to buy and maintain, costly since it takes up room in an IC facility, cumbersome since it decreases throughput, etc.). Therefore, a need exists for a burn-in methodology that reduces current problems and does not require special processing (i.e., integrated better with existing equipment and process flows).

Figure 1:
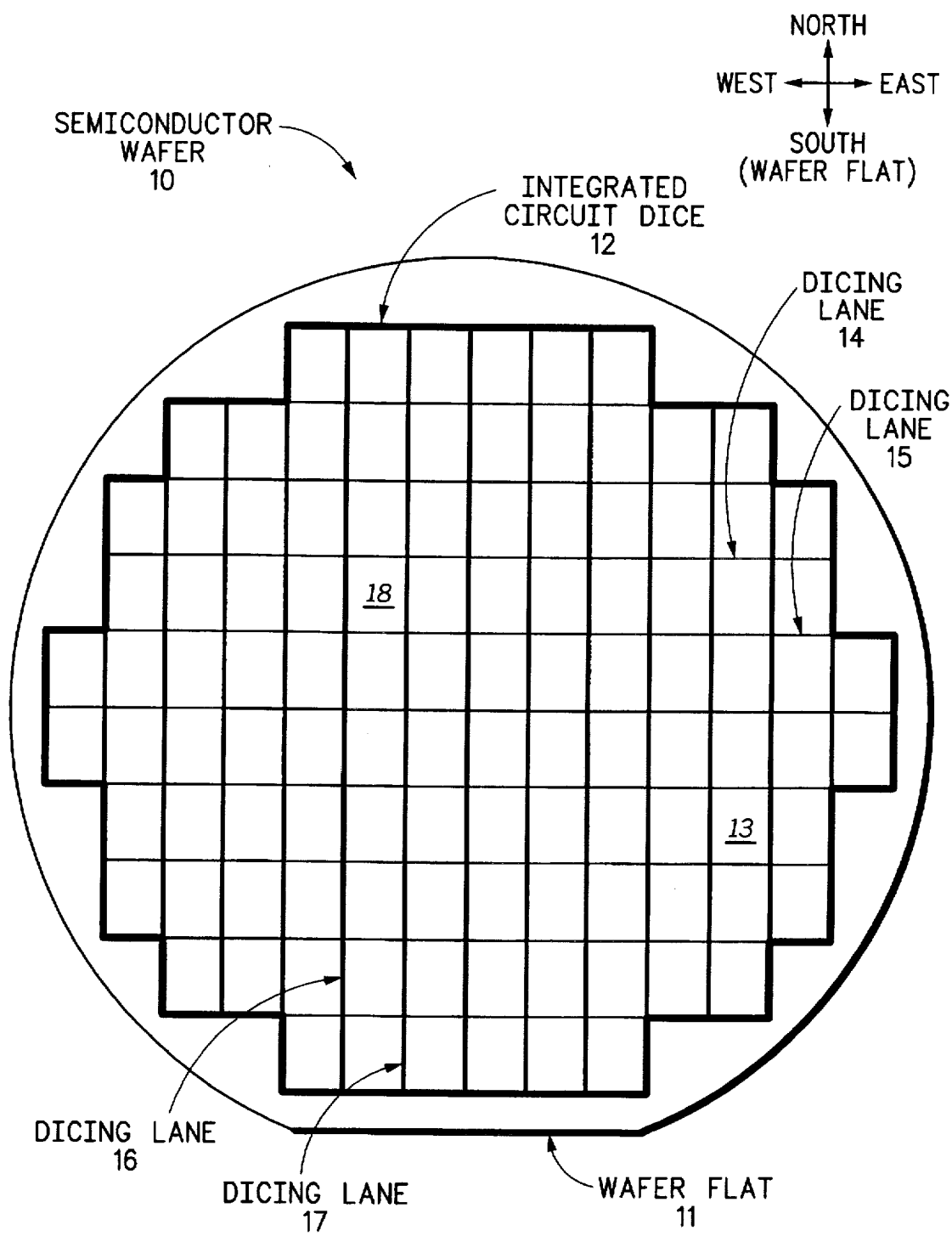
FIG. 1 illustrates a top view of a semiconductor wafer in accordance with the prior art.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Figure 14:
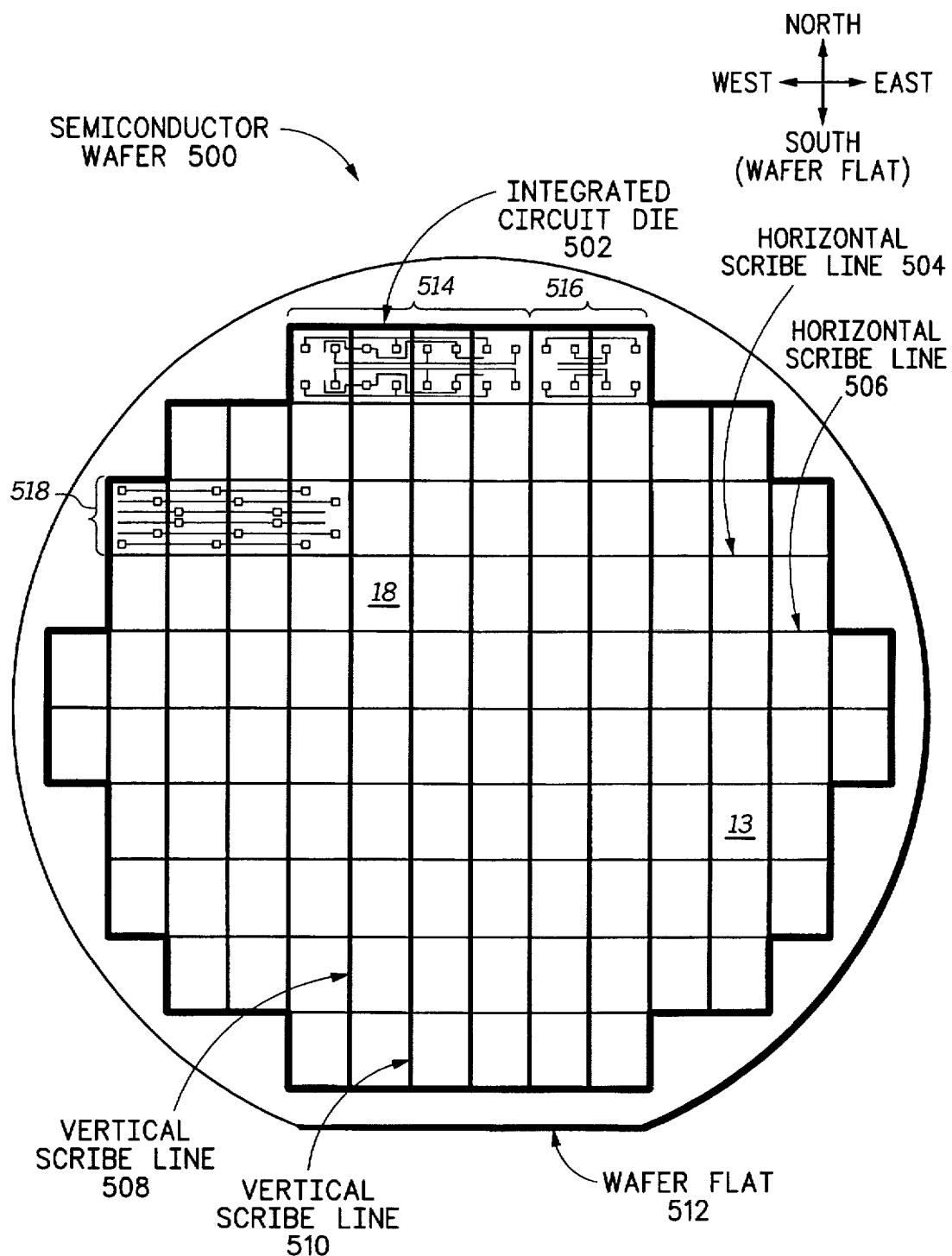
FIG. 14 illustrates, in a top perspective view, a wafer having an improved partitioned bussing structure and contact pads which overlie the functional IC die in accordance with the present invention.
Figure 15:
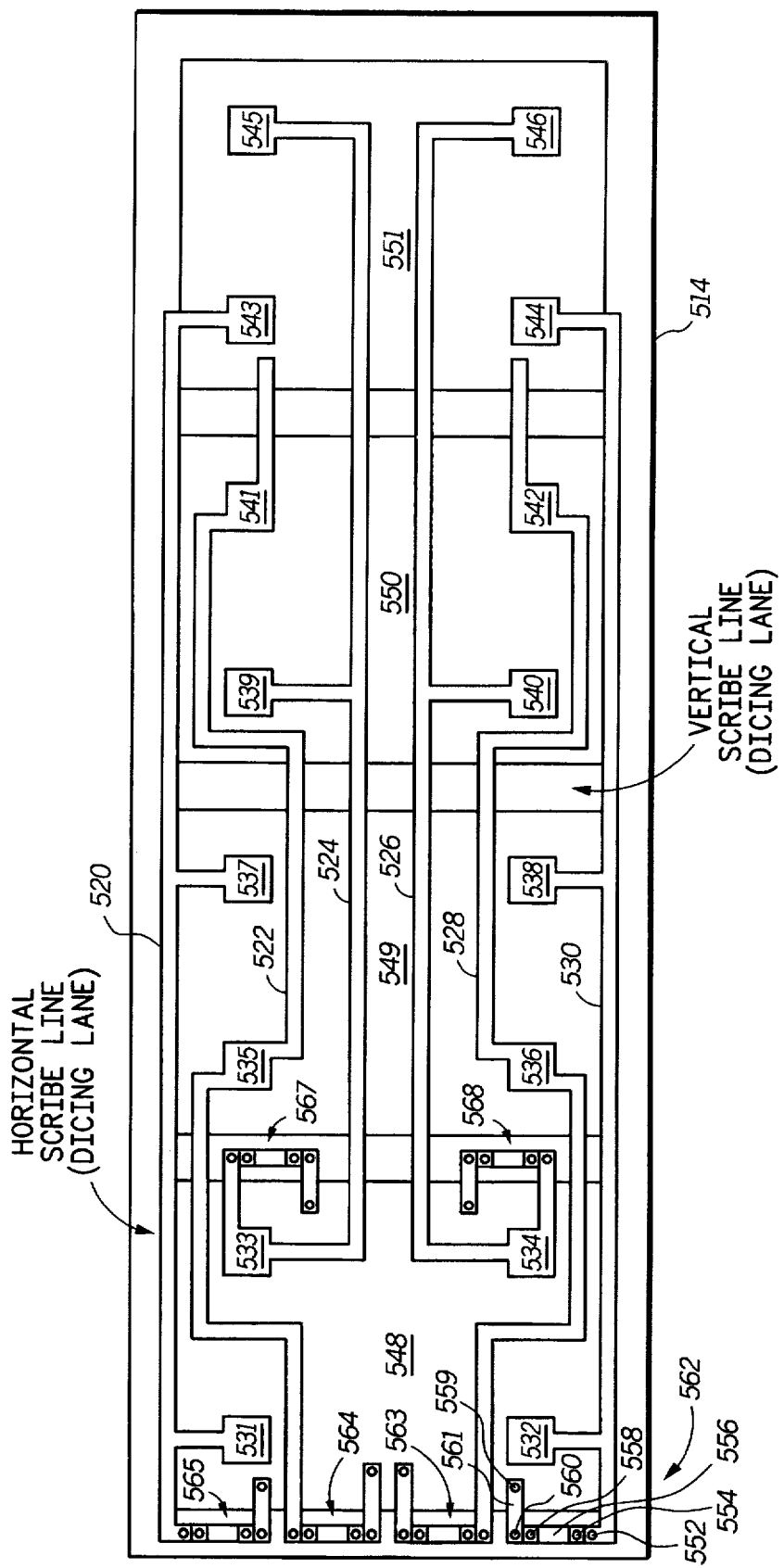
FIG. 15 illustrates, in a top perspective view, a plurality of integrated circuit that fit into one photolithographic reticle and contain a sub-bus architecture in accordance with the present invention.

The invention of FIGS. 1–13 is used to perform wafer level testing or burn-in of integrated circuit (IC) die. First, FIGS. 1–13 are discussed in detail below, then a FIGS. 14–15 illustrates an improvement to the FIGS. 1–13. In general, FIGS. 1–13 (see specifically FIG. 2) illustrates a system for testing a wafer in a wafer level burn-in system wherein the wafer contains wafer-wide busses 42–47 (i.e., conductive layers that run the entire length of the wafer, which can be several inches long each and couple to every IC die). These long buses are more than adequate for testing parts that have low power requirements and operate at slower speeds. The trend is that speed and power will continually increase (many high-powered IC microprocessors manufactured today require more than 1 watt of power and some can require up to tens of watts and increasing). In addition, most of these new microprocessors are running at speeds greater than 100 MHz. When this level of power and speed is needed, the length of the busses in FIG. 2 result in resistance problems, signal distortion problems, and a widening of the metal buses 42–47 until performance and manufacturability is greatly hampered. Further, the buses of FIG. 2 may not be able to supply the large power/current and fail, rendering testing via the FIG. 13 impossible. This problem of "long busses" is further exacerbated when using large-diameter wafers (such as 8" wafers) and is cause for further concern since wafer diameters are expected to increase from a maximum of 8" to 10" or 12" in the near future.

Figure 2:
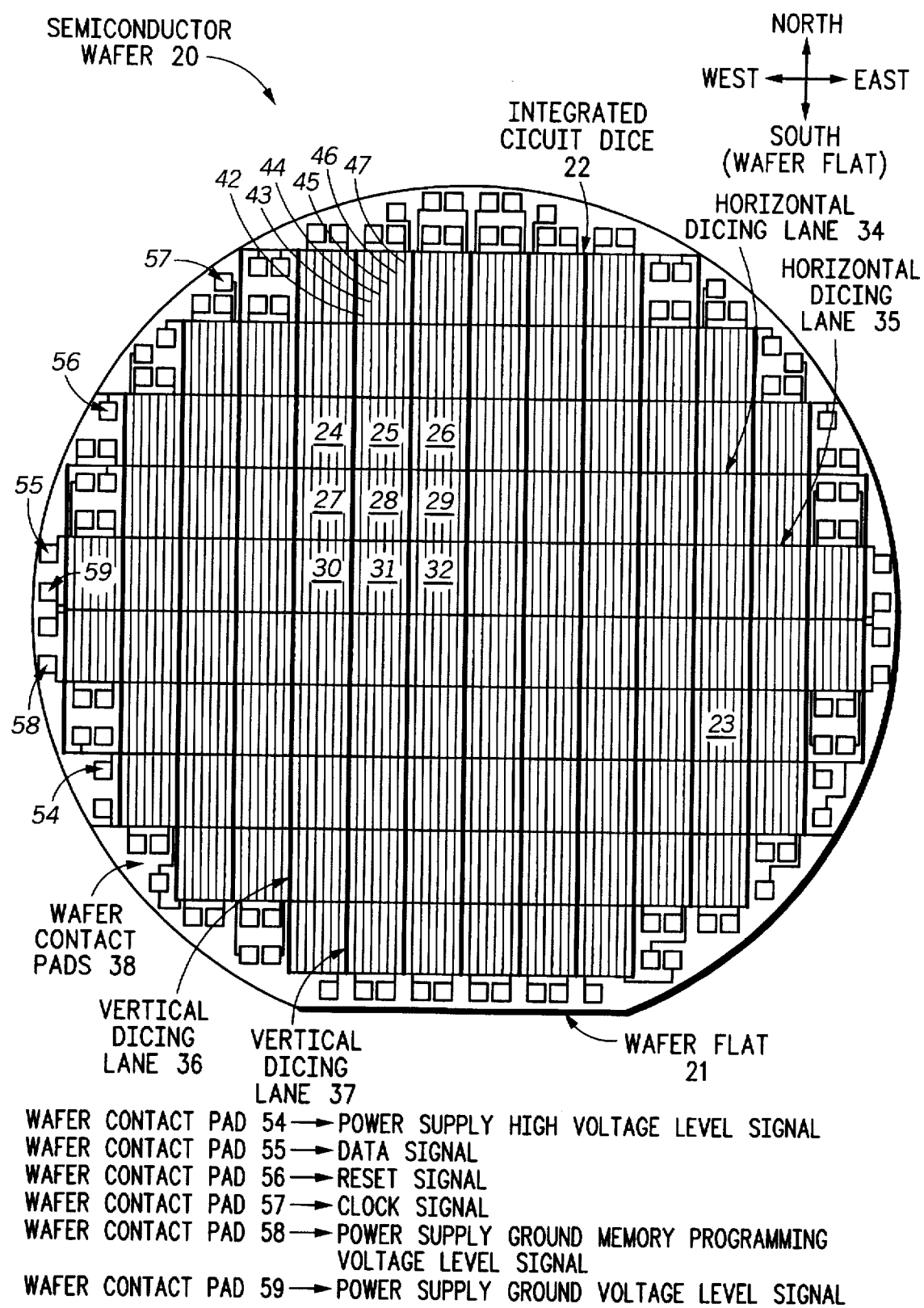
FIG. 2 illustrates a top view of a semiconductor wafer in accordance with one embodiment of the present invention.

Also, the IC die 22 in FIG. 2 are formed via widely used stepper machinery whereas the buses and contacts (for example 57, 56, 58, . . . in FIG. 2) cannot be formed via a stepper since they are wafer-wide and not reticle-wide or are formed outside of the scribe lines (dicing lanes) at the very periphery of the wafer. Instead, in FIG. 2, the peripheral wafer-test contacts 56, 57, 58, etc. are formed via projection printing which requires different equipment. In other words, the die 22 are formed via a stepper machine, and the top layer of test metal which includes the buses 42–47 and the contacts 56, 57, 58, etc. use a second piece of equipment which exposes the entire wafer in one exposure (does not step like a stepper). A stepper cannot expose an entire wafer in one light exposure and a projection printer cannot pattern a wafer in multiple exposures, so both machines are needed. Therefore, the IC fabrication facility must keep a line of steppers and a line of projection printers which increases cost, factory space, upkeep, and reduces throughput. Therefore, while the FIGS. 1–13 work remarkably well for nearly all ICs, an improved methodology is needed for high-powered microprocessors. FIGS. 14–15 illustrate the changes needed to utilize the teachings of FIG. 1–13 in other operational environments. This other operational environment will allow testing methods for high-powered microprocessors and other high-powered ICs wherein power problems are reduced, speed problems are reduced, high current problems which cause voltage drops in the bus structure are reduced, and only the industry-accepted steppers are needed with no need for outdated projection printing machines.

In general, FIGS. 1–15 teach how to perform thorough reliability tests on integrated circuit die while in wafer form. This allows semiconductor manufacturers to detect and screen out potentially all defective die right after the die have been manufactured, rather than after costly packaging has been performed. In addition, by performing thorough reliability testing on integrated circuit die while in wafer form, semiconductor manufacturers can meet the requirements of multi-chip module (MCM) manufacturers by supplying "known good die". The present invention can also be used to perform thorough electrical testing in a more cost efficient manner than the presently available probe equipment.

In performing wafer level testing of integrated circuit die, the present invention utilizes wafer conductors which, in one form (FIGS. 1–13), are formed at least partially overlying the integrated circuit die themselves, and in another form (FIGS. 14–15) formed nearly entirely overlying the functional ICs.

First, the embodiment of FIGS. 1–13 is discussed in detail and then further improvements for high-powered ICs are discussed via FIGS. 14–15. Referring to FIG. 2, vertical conductors 42–47 overlie integrated circuit die 25, 28, and 31; and each vertical conductor 42–47 is a portion of a wafer conductor. One embodiment of the present invention illustrated in FIG. 2 has six separate top-most wafer conductors for transferring six different electrical signals; and each of the six wafer conductors includes a plurality of horizontal conductors and a plurality of vertical conductors. The six conductor signals in FIG. 2 are reset, clock, Vdd (power), Vpp (floating gate power supply), Vss (ground), and test data. Usually the top-most metal is an upper layer of metal separated from other metal by polyimide of roughly 1 micron to 10 microns in thickness.

As indicated above, the wafer conductors in the present invention are electrically insulated from the underlying integrated circuit die by an insulating layer (polyimide), except at selected locations where each wafer conductor is electrically coupled to a lower layer of metal or polysilicon through a via or contact opening. These wafer conductors can then be used to transfer voltage levels to the integrated circuit die through a plurality of layers of conductive material. In many ICs today, the IC will contain at least one layer of polysilicon or amorphous silicon and at least one layer of metal. It is not unusual for an IC to contain up to ten conductive layers of metal and/or poly in some combination.

Thus by using these wafer conductors to transfer signals to, and possibly from, the integrated circuit die, it is possible to test the integrated circuit die in wafer form. By allowing top-most wafer conductors to be formed overlying the integrated circuit die, the entire area of a semiconductor wafer is now available for the routing of wafer conductors for wafer level testing and burn-in. This is a significant area and design advantage.

Semiconductor manufacturers have the goal of maximizing the number of integrated circuit die on a wafer in order to maximize profits. Unfortunately, in the prior art, any test conductors or test circuitry were limited to the unused periphery of the wafer near the wafer flat, and to the narrow dicing lanes which separated the integrated circuit die. If more area was needed in the prior art, then the number of integrated circuit die on the wafer had to be reduced in order to provide more space for the test conductors and test circuitry. However, reducing the number of integrated circuit die formed on each wafer reduced profits.

The present invention does not require that the number of die formed on the wafer be reduced or that the dicing lanes be enlarged. The present invention can still make use of the unused periphery of the die and the narrow dicing lanes; but in addition, the present invention can use the area overlying the integrated circuits, which is the vast majority of the area on most wafers. After wafer level testing of the integrated circuit die has been completed, the wafer conductors are no longer needed and may be completely removed, partially removed, or left in place, depending upon the particular embodiment.

Of course it is very important that additional processing steps performed on a semiconductor wafer do not reduce the yield or degrade the reliability of the integrated circuit die. The yield is the percentage of integrated circuit die on a wafer which are fully functional. For example, if there are 100 integrated circuit die on a wafer, and 90 are fully functional, then the yield for that wafer is 90%. The reliability of the integrated circuit die is determined by the number of integrated circuit die which are fully functional over a period of time compared to the total number of circuit die. In the present invention, the depositing, etching, and removal of a significant number of metal conductors overlying the integrated circuit die has not been found to reduce the yield or degrade the reliability of the integrated circuit die in a significant manner.

There are two broad categories of electrical tests which can be performed on an integrated circuit die. The first category is functional tests. Functional tests are used to verify the logical functionality of the die independent of timing, AC characteristics, current and voltage levels, or other parametric values associated with the integrated circuit die. This test ensures that an adder adds, a multiplier multiplies, a bus unit controls the bus, a memory stores bits properly, etc. The second category is parametric tests. Parametric tests are used to measure integrated circuit die characteristics over a continuous range of inputs parameters, such as voltage, current, timing, power, etc.

Unfortunately, performing the full range of electrical tests on an integrated circuit die does not guarantee that the integrated circuit die will continue to function properly. It is common to have integrated circuit die which function properly for a short period of time and then fail. This problem is commonly called "infant mortality". Some integrated circuit die have circuitry which is particularly susceptible to infant mortality. In addition, some integrated circuit die contain non-volatile memory circuitry which requires long data retention periods to determine if the memory cells function properly.

In order to screen out integrated circuit die which will fail due to infant mortality, reliability testing is performed. Reliability testing is electrical testing which is performed over an extended period of time. Burn-in testing is reliability testing which is performed at elevated temperatures. The burn-in tests can include any combination of functional patterns, elevated voltages, and/or any stress to cause weak devices to fail before shipment.

FIG. 1 illustrates a semiconductor wafer 10 in accordance with the prior art. Semiconductor wafer 10 has a plurality of integrated circuit die 12 which are formed thereon. The plurality of integrated circuit die 12 are arranged in a plurality of rows and columns which are separated by a plurality of dicing lanes, such as horizontal dicing lanes 14–15 and vertical dicing lanes 16–17. The dicing lanes are also known in the art as scribe lines since these lines are scribed, cut, or sawed to separate the wafer into individual die. Integrated circuit die 13 and integrated circuit die 18 are each one of the plurality of integrated circuit die 12.

The directionality indicators north, south, east, and west have been added to FIGS. 1–5 to help orient one figure with respect to another figure. East-west lines are considered to be parallel to the wafer flat 11, and north-south lines are considered to be perpendicular to the wafer flat 11. Wafer flats are sometimes replaced by wafer notches or a wafer may have several flats. The flats can be used to identify the type of wafer (whether it is P type or N type) and is also used to align wafers mechanically or optically in a machine.

FIG. 2 illustrates a semiconductor wafer 20 in accordance with one embodiment of the present invention. Semiconductor wafer 20 has a plurality of integrated circuit die 22 which are formed thereon. The plurality of integrated circuit die 22 are arranged in a plurality of rows and columns which are separated by a plurality of dicing lanes, such as horizontal dicing lanes 34–35 and vertical dicing lanes 36–37. Integrated circuit die 23–32 are each one of the plurality of integrated circuit die 22. The plurality of integrated circuit die 22 may or may not be identical to each other and may even be of varying sizes. In one embodiment of the present invention, each of the plurality of integrated circuit die 22 is a data processor, but it should be understood that the die may be memories, analog circuits or any IC which is manufactured on a wafer.

Integrated circuit die 28 illustrated in FIG. 2 has the same die location as integrated circuit die 18 illustrated in FIG. 1. Likewise, integrated circuit die 23 illustrated in FIG. 2 has the same die location as integrated circuit die 13 illustrated in FIG. 1. Die location is determined by an integrated circuit die's physical location on a wafer. Die location can be described in a variety of ways. For example, each integrated circuit die on a wafer can be given a unique identifier, such as a sequential number or column and row coordinates which correspond to one particular integrated circuit die location on each wafer.

A plurality of wafer contact pads 38 are located around the periphery of semiconductor wafer 20 (small square area at the extreme periphery of the wafer 20). Wafer contact pads 54–59 are each one of the wafer contact pads 38. Wafer contact pads 54–59 are each coupled to a different wafer conductor, and each wafer conductor transfers a different electrical signal.

In one embodiment of the present invention, wafer contact pad 54 is electrically coupled to a wafer conductor which conducts a power supply high voltage level; wafer contact pad 55 is electrically coupled to a wafer conductor which conducts a data signal; wafer contact pad 56 is electrically coupled to a wafer conductor which conducts a reset signal; wafer contact pad 57 is electrically coupled to a wafer conductor which conducts a clock signal; wafer contact pad 58 is electrically coupled to a wafer conductor which conducts a power supply memory programming voltage level; and wafer contact pad 59 is electrically coupled to a wafer conductor which conducts a power supply ground voltage level.

The remaining wafer contact pads 38 are redundant wafer contact pads (they can be used to contact the same signal [one of Vdd, Vss, Vpp, reset, clock, and test data in multiple places to reduce signal decay and resistance and aid in reducing propagation delay across the wafer). The minimum number of wafer contact pads required in one embodiment of the present invention is six, namely wafer contact pads 54–59. However, for increased reliability and signal integrity, multiple wafer contact pads are usually coupled to the same wafer conductor. Thus, if the electrical coupling between one wafer contact pad, pogo pin, or pad and its corresponding wafer conductor is weak or faulty, the electrical coupling between a different wafer contact pad, pogo pin, or pad and the same wafer conductor can still be used to transfer a signal to or from wafer 20. Parallel couplings are also known to reduce unwanted signal line inductance.

In addition, it may be useful to have redundant wafer contact pads coupled to a wafer conductor which is used to conduct a significant amount of current, such as the wafer conductor which conducts a power supply high voltage level signal. In some embodiments, a plurality of redundant wafer contact pads may be required in order to provide signal integrity across the semiconductor wafer, for example, by reducing voltage drops to an acceptable level. Note that the redundant wafer contact pads are used in parallel with each other. Unlike redundant memory cells, a redundant wafer contact pad is used in addition to other wafer contact pads, not instead of another wafer contact pad (contact pads need not be mutually exclusive but can be connected in parallel).

In one embodiment of the present invention (see FIG. 2), the wafer contact pads 38 and the wafer conductors are made of a single metal layer, such as aluminum. In an alternate embodiment of the present invention, the wafer contact pads 38 and the wafer conductors are made of a plurality of stacked metal layers formed one on top of the other, such as titanium, tungsten, and/or copper. In alternate embodiments of the present invention, the wafer contact pads 38 and the wafer conductors can be made of any appropriate conductive material. The wafer contact pads 38 and the wafer conductors can be made of the same conductive material or materials, or can be made of different conductive materials.

For further improvement, in an additional embodiment, a plurality of wafer contact pads 38 can be formed overlying the integrated circuit die 22 (see FIG. 14). In one embodiment of the present invention, any portion of the integrated circuit die 22 which has one or more wafer contact pads 38 overlying it is sacrificed and is not used to contain active circuitry due to the physical pressure placed on the integrated circuit die 22 during testing by the pogo pins. This pressure problem can be fixed by insulating the top-layer of metal used to form the pads 38 from the rest of the underlying IC by a thick (2–10 micron or so) layer of polyimide (4–5 microns in thickness is preferred in many embodiments). In alternate embodiments of the present invention, the wafer contact pads 38 could be located anywhere on semiconductor wafer 20, not just in the periphery around the outer edge of semiconductor wafer 20.

In some embodiments of the present invention, the plurality of integrated circuit die 22 (see FIG. 2) are identical to each other. In alternate embodiments of the present invention, the plurality of integrated circuit die 22 may vary from each other in a manner which allows each die to be individually located on the semiconductor wafer. For example, each integrated circuit die 22 may have a unique identification code.

Figure 3:
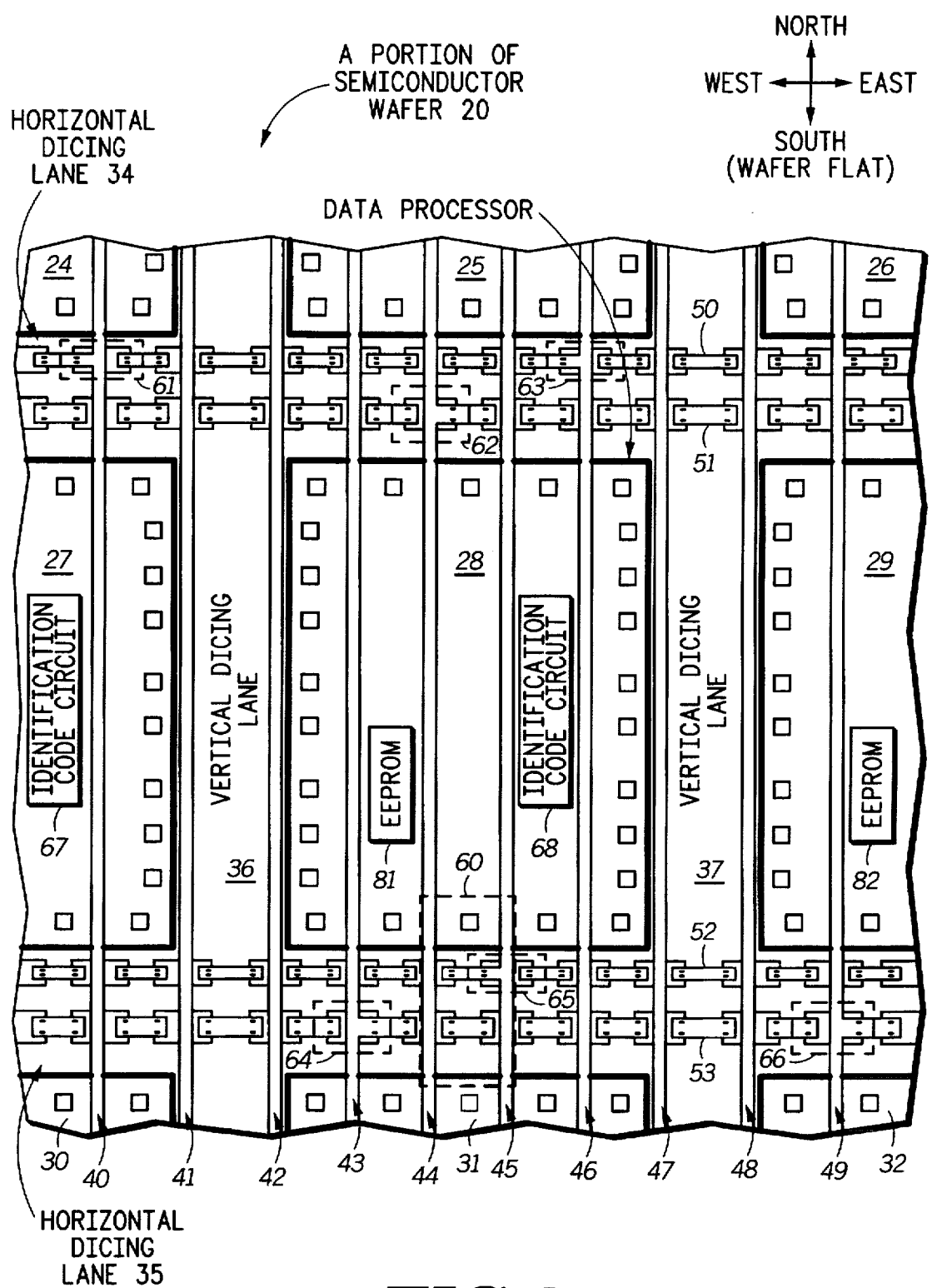
FIG. 3 illustrates a portion of the semiconductor wafer illustrated in FIG. 2, in accordance with one embodiment of the present invention.

Referring to FIG. 3, integrated circuit die 27 may have an identification code circuit 67 which stores a unique identification code, and integrated circuit die 28 may have an identification code circuit 68 which stores a different identification code. A one-to-one mapping can then be made between each unique identification code and each available die location on the semiconductor wafer. The identification code circuits 67 and 68 may be identical except for the identification code which they store.

In some embodiments of the present invention, the identification code circuits 67 and 68 may include non-volatile memory cells (not shown) such as read only memory (ROM) cells. There are a variety of ways to program these ROM cells with a different identification code for each integrated circuit die 22. In one embodiment, a different pattern on the processing mask is used for each integrated circuit die 22 during the processing step which programs the ROM. Each of the different patterns programs the ROM on each integrated circuit die 22 with a different identification code. One disadvantage to this approach is that a significant number of different patterns are required to be formed on one mask.

In an alternate embodiment of the present invention, a programmable light source can be used as part of the stepper apparatus which exposes the photoresist during the manufacture of integrated circuit die 22. The non-volatile memory cells on integrated circuit die 22 can be aligned with the programmable light source on the stepper apparatus so that the programmable light source can be used to selectively program the non-volatile memory cells. For example, by exposing five non-volatile memory cells to light, the circuit connections can be made such that those five memory cells are programmed to a logic level one. And by not exposing three different non-volatile memory cells to light, the circuit connections can be made such that those three cells are programmed to a logic level zero. In this manner, each integrated circuit die 22 may be programmed with a unique identification code, without the need for different programming patterns in each die position on a whole wafer projection print mask.

FIG. 3 illustrates a portion of semiconductor wafer 20 of FIG. 2. The particular portion of semiconductor wafer 20 illustrated in FIG. 3 includes integrated circuit die 28, and portions of integrated circuit die 24–27 and 29–32. In one embodiment of the present invention, vertical conductors 40–49 run the full length of a column of integrated circuit die. A vertical conductor may overlie one, several, or all integrated circuit die in a column. For example, vertical conductor 40 overlies all of the die in a first column, including die 24, 27, and 30; vertical conductors 43–46 overlie all of the die in a second column, including die 25, 28, 31; and vertical conductor 49 overlies all of the die in a third column, including die 26, 29, and 32. Alternately, a vertical conductor may be placed in a vertical dicing lane (e.g. vertical conductors 41–42 are placed in vertical dicing lane 36, and vertical conductors 47–48 are placed in vertical dicing lane 37).

Note that FIG. 2 illustrates an embodiment in which six vertical conductors overlie each integrated circuit die in a column, and FIG. 3 illustrates an embodiment in which two of the six vertical conductors are place in the vertical dicing lanes for improved conductor spacing. Alternate embodiments of the present invention may have any number of vertical conductors overlying the integrated circuit die and may have any number of vertical conductors placed in the vertical dicing lanes. However, the advantage to placing all of the vertical conductors so that they overlie integrated circuit die is that the vertical dicing lanes are left available for various other circuitry and patterns which have normally filled the available space in the dicing lanes.

Thus, in alternate embodiments of the present invention, none of the vertical conductors may be formed in the vertical dicing lanes, but instead, all of the vertical conductors may be formed overlying integrated circuit die. In the embodiment of the present invention illustrated in FIG. 3, the vertical dicing lanes would have to be expanded in order to fit all of the required vertical conductors in the dicing lanes. It is undesirable to expand the width of the dicing lanes because the extra semiconductor area required for the dicing lanes may require that the number of die formed on the wafer be reduced.

In one embodiment of the present invention, horizontal conductors 50–51 are placed in horizontal dicing lane 34 and run almost the entire width of wafer 20. Likewise, horizontal conductors 52–53 are placed in horizontal dicing lane 35 and run almost the entire width of wafer 20. In alternate embodiments of the present invention, one or more horizontal conductors may overlie each integrated circuit die in a row, as long as provision is made so that the vertical conductors and the horizontal conductors are electrically coupled only at selected interconnect points.

Semiconductor region 61 outlines an area in horizontal dicing lane 34 in which vertical conductor 40 is electrically coupled to horizontal conductor 50. Semiconductor region 62 outlines an area in horizontal dicing lane 34 in which vertical conductor 44 is electrically coupled to horizontal conductor 51. Semiconductor region 63 outlines an area in horizontal dicing lane 34 in which vertical conductor 46 is electrically coupled to horizontal conductor 50. Semiconductor region 64 outlines an area in horizontal dicing lane 35 in which vertical conductor 43 is electrically coupled to horizontal conductor 53. Semiconductor region 65 outlines an area in horizontal dicing lane 35 in which vertical conductor 45 is electrically coupled to horizontal conductor 52. Semiconductor region 66 outlines an area in horizontal dicing lane 35 in which vertical conductor 49 is electrically coupled to horizontal conductor 53.

In one embodiment of the present invention, vertical conductor 42 (see FIG. 3) is a portion of the wafer conductor which is electrically coupled to wafer contact pad 54 (see FIG. 2) and which conducts a power supply high voltage level signal. Vertical conductor 43 is a portion of the wafer conductor which is electrically coupled to wafer contact pad 55 and which conducts a data signal. Vertical conductor 44 is a portion of the wafer conductor which is electrically coupled to wafer contact pad 56 and which conducts a reset signal. Vertical conductor 45 is a portion of the wafer conductor which is electrically coupled to wafer contact pad 57 and which conducts a clock signal. Vertical conductor 46 is a portion of the wafer conductor which is electrically coupled to wafer contact pad 58 and which conducts a power supply memory programming voltage level signal. Vertical conductor 47 is a portion of the wafer conductor which is electrically coupled to wafer contact pad 59 and which conducts a power supply ground voltage level signal.

In addition, in one embodiment of the present invention, vertical conductor 40 (see FIG. 3) is a portion of the wafer conductor which is electrically coupled to wafer contact pad 58 (see FIG. 2) and which conducts a power supply memory programming voltage level signal. Vertical conductor 41 is a portion of the wafer conductor which is electrically coupled to wafer contact pad 59 and which conducts a power supply ground voltage level signal. Vertical conductor 48 is a portion of the wafer conductor which is electrically coupled to wafer contact pad 54 and which conducts a power supply high voltage level signal. Vertical conductor 49 is a portion of the wafer conductor which is electrically coupled to wafer contact pad 55 and which conducts a data signal.

Thus in one embodiment of the present invention, a wafer conductor includes one or more vertical conductors and one or more horizontal conductors. Each wafer conductor is then coupled to one or more wafer contact pads 38.

Semiconductor region 60 is a portion of the semiconductor wafer 20 illustrated in FIG. 2 and FIG. 3. Semiconductor region 60 is illustrated in more detail in FIG. 4. An alternate embodiment of semiconductor region 60, namely semiconductor region 60', is illustrated in more detail in FIG. 5.

Figure 4:
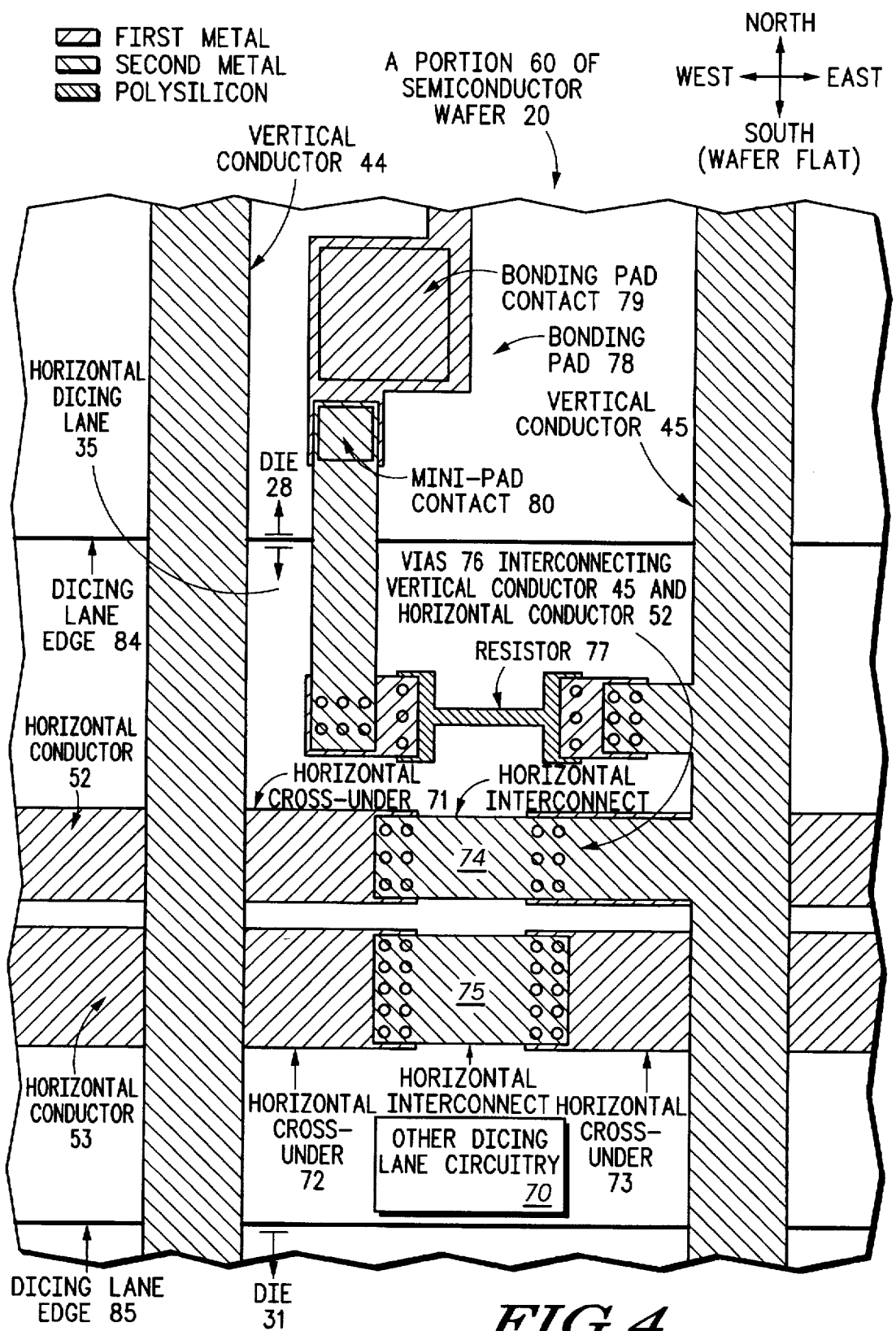
FIG. 4 illustrates a sub-portion of the portion of the semiconductor wafer illustrated in FIG. 3, in accordance with one embodiment of the present invention.

FIG. 4 illustrates a region or a portion 60 of semiconductor wafer 20 (see FIGS. 2–3). Dicing lane edge 84 separates integrated circuit die 28 from horizontal dicing lane 35. Dicing lane edge 85 separates integrated circuit die 31 from horizontal dicing lane 35. Horizontal conductors 52–53 are formed in dicing lane 35. Horizontal conductor 52 includes horizontal cross-under 71 and horizontal interconnect 74. Horizontal conductor 53 includes horizontal cross-under 72, horizontal interconnect 75, and horizontal cross-under 73.

Horizontal conductor 52 crosses under vertical conductor 44 by way of horizontal cross-under 71; thus horizontal conductor 52 and vertical conductor 44 are not electrically coupled in region 60. An insulating layer (not shown) lies between horizontal conductor 52 and vertical conductor 44. This insulating layer (not shown) prevents electrical contact between the first metal layer and the second metal layer unless vias or contacts have been etched in the insulating layer.

Horizontal conductor 53 crosses under vertical conductor 44 by way of horizontal cross-under 72; thus horizontal conductor 53 and vertical conductor 45 are not electrically coupled in region 60. An insulating layer (not shown) lies between horizontal conductor 53 and vertical conductor 45.

Horizontal conductor 53 crosses under vertical conductor 45 by way of horizontal cross-under 73; thus horizontal conductor 53 and vertical conductor 45 are not electrically coupled in region 60. An insulating layer (not shown) lies between horizontal conductor 53 and vertical conductor 45.

Vias 76 are used to electrically couple vertical conductor 45 and horizontal conductor 52. The vias 76 are contacts formed through an insulating layer (not shown) which lies between vertical conductor 45 and horizontal conductor 52.

Other dicing lane circuitry 70, located in dicing lane 35, includes a variety of circuitry known in the prior art which may be useful to include on wafer 20. For example, other dicing lane circuitry 70 may include test patterns which can be used to determine parametrics at various locations across wafer 20. In addition, other dicing lane circuitry 70 may include alignment patterns which are used to properly align wafer 20 during the manufacturing process. Other dicing lane circuitry 70 may be spread throughout the horizontal and vertical dicing lanes on wafer 20. Other dicing lane circuitry 70 does not include any circuitry or test patterns which are required to practice the present invention.

In some embodiments of the present invention, a resistor is used to protect against excessive current flow between a wafer conductor and a bonding pad. For example, in FIG. 4, resistor 77 is electrically coupled between bonding pad 78 on integrated circuit die 28, and the wafer conductor which includes vertical conductor 45. In one embodiment of the present invention, resistor 77 serves a current limiting function. In an alternate embodiment of the present invention, resistor 77 serves the function of a fuse. Alternate embodiments of the present invention may use other methods for isolating one or more faulty, shorted die from a wafer conductor.

As an example, integrated circuit die 28 could be defective because bonding pad 78 is unintentionally shorted to a power supply high voltage level. In an embodiment using a current limiting resistor, such as resistor 77, the current limiting resistor will remain intact and serve to limit the current flow to or from integrated circuit die 28. Thus current limiting resistor 77 will prevent faulty integrated circuit die 28 from causing a significant voltage drop in the test buses or top level conductors. As a result, current limiting resistor 77 ensures that the voltage level of the wafer conductor does not vary significantly from the intended voltage level.

In an embodiment using resistor 77 as a fuse, the excessive current flow through the high resistance polysilicon resistor 77 will cause polysilicon resistor 77 to be destroyed. In an embodiment using a resistive element as a fuse, an open circuit will be formed between bonding pad 78 and the wafer conductor. Thus resistor 77 will create an open circuit between integrated circuit die 28 and the wafer conductor which includes vertical conductor 45 when the current flow through resistor 77 exceeds a predetermined maximum current limit. The predetermined maximum current limit can be varied by varying the resistance and physical characteristics of resistor 77.

In the embodiment using resistor 77 as a fuse, resistor 77 breaks the electrical coupling between a wafer conductor and a bonding pad if the current flow is too great. Resistor 77 thus protects other integrated circuit die which are coupled to the same wafer conductor from being damaged by an excessive current flow.

In one embodiment of the present invention, a resistive element is used each time a wafer conductor is coupled to a bonding pad. Alternate embodiments of the present invention may use other approaches to ensure that excessive current due to one or more defective integrated circuit die does not harm the remaining non-defective die.

Note that in one embodiment of the present invention, only six wafer conductors are required in order to perform wafer level testing. Thus, only six bonding pads on each integrated circuit die 22 (see FIG. 2) need to be electrically coupled to a wafer conductor. Thus, although each integrated circuit die 22 may have a large number of bonding pads, only a few of the bonding pads on each integrated circuit die must be electrically coupled to a wafer conductor. For example, in one embodiment of the present invention, each of the plurality of integrated circuit die 22 is a data processor, having dozens of individual bonding pads. In this embodiment, only a small percentage of the bonding pads on each integrated circuit die 22 must be electrically coupled to a wafer conductor.

In some embodiments of the present invention, each integrated circuit die 22 has one or more redundant bonding pads for certain signals, for example, signals such as power and ground. In these embodiments, one or more of these redundant bonding pads may be coupled to the same wafer conductor in order to improve reliability and to supply the same electrical signal to multiple bonding pads on each integrated circuit die 22.

Referring to FIG. 4, in one embodiment of the present invention the bonding pads which are coupled to a wafer conductor, such as bonding pad 78, include two separate contacts, namely bonding pad contact 79 and mini-pad contact 80. The advantage to using mini-pad contact 80 is that the bonding pad 78 can be electrically coupled to a wafer conductor without having to disturb bonding pad contact 79. Thus, bonding pad contact 79 remains protected by an overlying insulating layer (not shown) during reliability testing and burn-in. Thus, an etch process step which is used to remove the wafer conductor (e.g. an etch process step to remove second layer metal) will not etch into or remove the bonding pad contact 79. In some embodiments of the present invention, bonding pad contact 79 is electrically coupled to a wire-bond wire when integrated circuit die 28 is packaged.

Although the embodiment of the present invention illustrated in FIG. 4 shows the vertical conductors being formed from second layer metal and the horizontal conductors being formed from both first and second layer metal, alternate embodiments of the present invention may use any appropriate combination of conductive layers to form the wafer conductors. In addition, although the illustrated embodiment shows the wafer conductors as being formed using only vertical conductors and the horizontal conductors, alternate embodiments of the present invention may use diagonal conductors, or even conductors which snake in various directions across wafer 20.

Alternate embodiments of the present invention may segment wafer 20 into a plurality of wafer segments. For example, referring to FIG. 2, all of the integrated circuit die west of vertical dicing lane 36 may be part of a first wafer segment, and all of the integrated circuit die east of vertical dicing lane 36 may be part of a second wafer segment. Each wafer segment may have its own set of wafer conductors. That is, a first set of wafer conductors used to transfer test signals to the first wafer segment may not be the same as and may not be electrically coupled to the second set of wafer conductors used to transfer test signals to the second wafer segment. The signals transferred by the first set of wafer conductors may even be different than the signals transferred by the second set of wafer conductors.

Figure 5:
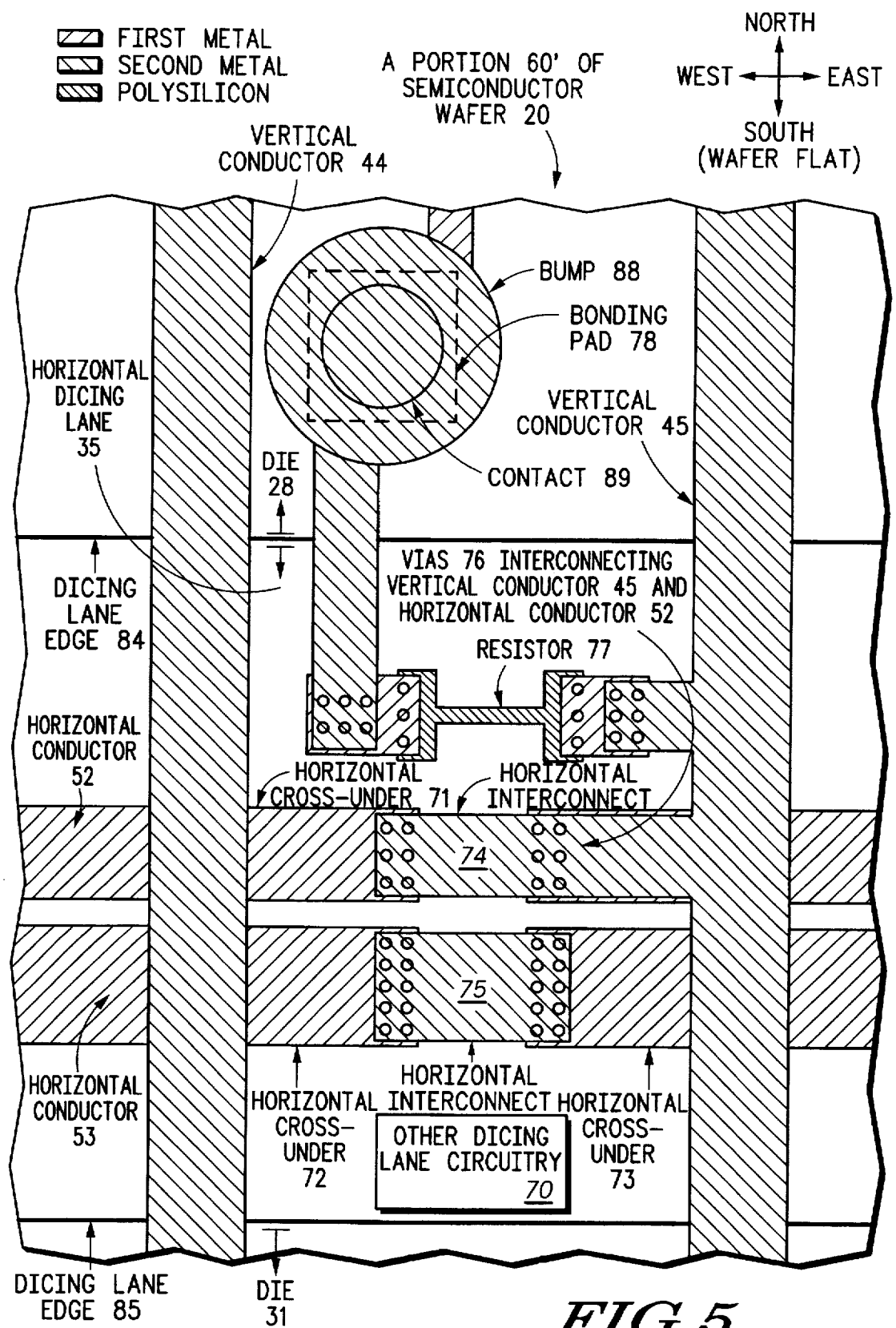
FIG. 5 illustrates a sub-portion of the portion of the semiconductor wafer illustrated in FIG. 3 in accordance with an alternate embodiment of the present invention.

FIG. 5 illustrates a region or a portion 60' of semiconductor wafer 20. FIG. 5 is an alternate embodiment of semiconductor region 60 of FIG. 3. FIG. 5 is the same as FIG. 4 with the exception of the bonding pad area. FIG. 5 illustrates the use of a metal bump 88 as the bonding pad 78. Contact 89 in FIG. 5 serves a similar function as bonding pad contact 79 in FIG. 4. Contact 89 is used to electrically couple the circuitry on integrated circuit die 28 to the wafer conductor which includes vertical conductor 45.

Referring to FIG. 5, wire-bond wires are not used when integrated circuit die 28 is packaged. Instead, bump 88 is used to make direct contact to a board level conductor, such as a conductor on a printed circuit board. Note that the differences between FIG. 4 and FIG. 5 have to do with the implementation of the bonding pad area on the integrated circuit die. The present invention can be used with a wide variety of bonding pad implementations. The manner in which a wafer conductor is coupled to an integrated circuit die depends upon the particular implementation.

Figure 6:
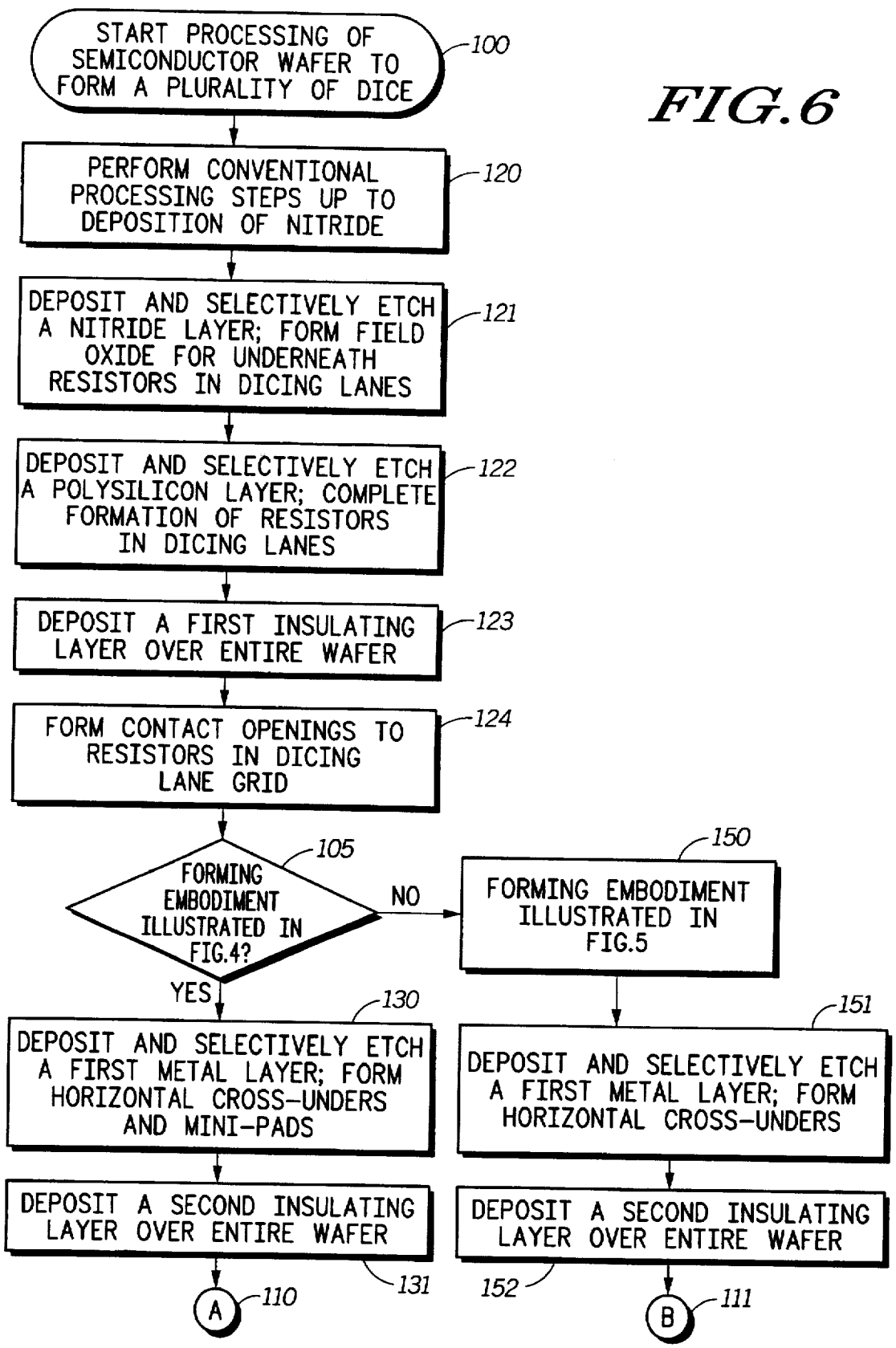
FIGS. 6–8 illustrate, in flow diagram form, a method of forming a semiconductor wafer in accordance with one embodiment of the present invention.
Figure 7:
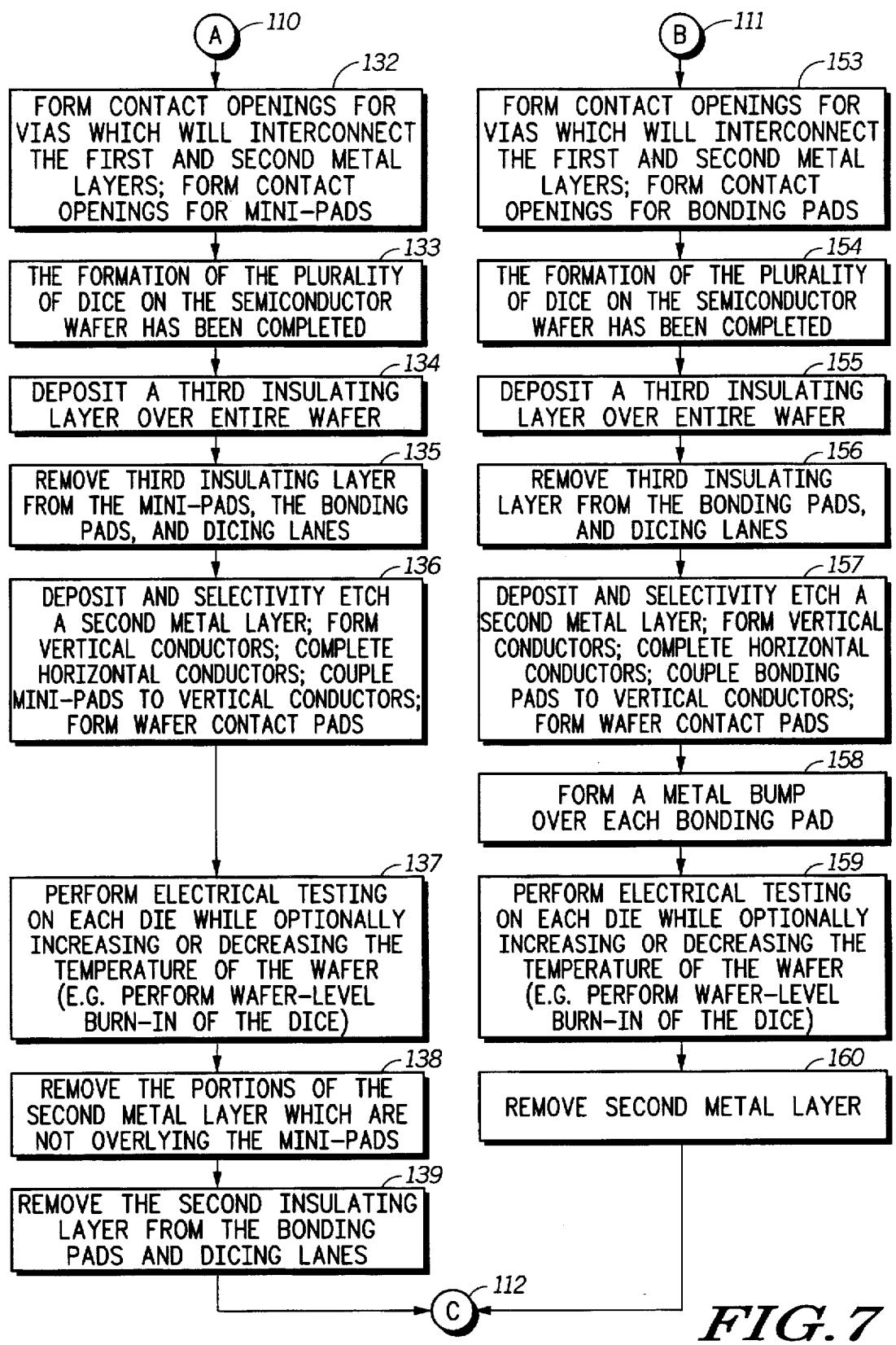
Figure 8:
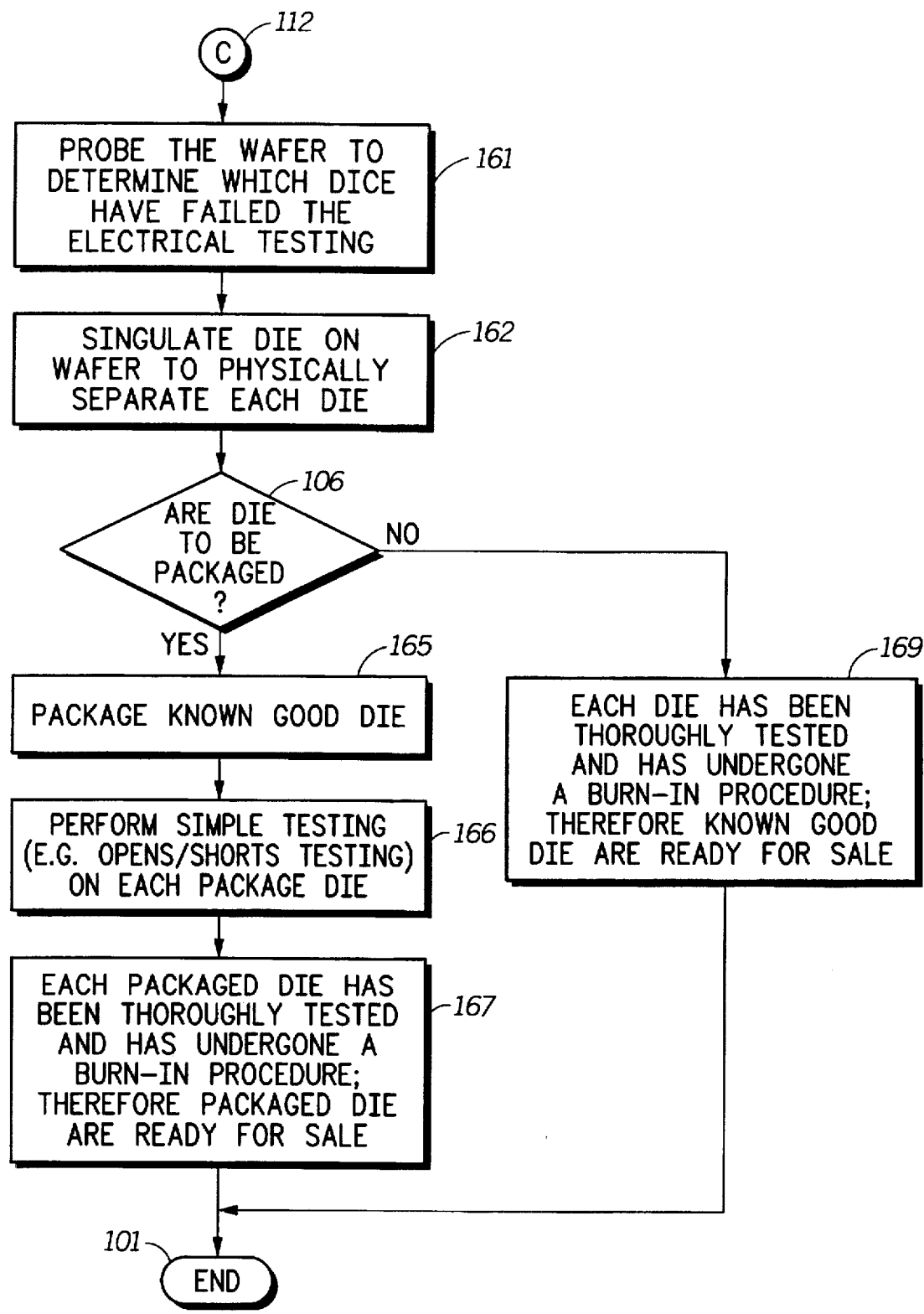

FIGS. 6-8 illustrate, in flow diagram form, a method of forming a semiconductor wafer in accordance with one embodiment of the present invention. Oval 100 represents a starting point for the flow diagram, and oval 101 represents an ending point for the flow diagram. Diamonds 105 and 106 represent decisions points which affect the subsequent path that is taken in the flow diagram.

Rectangles 120-124 represent steps which are performed at the beginning of the flow diagram. Note that the steps indicated by rectangle 120, namely "performing processing steps up to the deposition of nitride", are the same processing steps that are performed to manufacture the prior art wafer 10 illustrated in FIG. 1. Although most of the steps described in FIGS. 6-8 are also performed to manufacture the prior art wafer 10 (see FIG. 1), most of the steps have been modified to form the elements required by the present invention. For example, the prior art includes a step similar to rectangle 122 in which polysilicon is deposited and selectively etched to form circuitry on the integrated circuit die. However, in the prior art, polysilicon resistors such as resistor 77 in FIG. 4 were not formed.

Rectangles 130–139 represent steps which are performed in order to form the embodiment of the present invention which is illustrated in FIG. 4. Rectangles 150–160 represent steps which are performed in order to form the embodiment of the present invention which is illustrated in FIG. 3. Rectangles 161–162, rectangles 165–167, and rectangle 169 represent steps which are performed after the integrated circuit die have been electrically tested. Circles 110–112 represent particular points in the process flow.

In one embodiment of the present invention, an additional mask is required in order to selectively etch the second metal layer. However, because the geometries required for this second metal layer are so large, this is an inexpensive addition to the processing costs. In this same embodiment, only minor modifications are required to existing masks in order to form the remaining elements used by the present invention. In addition, because the geometries required for this second metal layer are so large, the probability of defects in the formation of wafer conductors, wafer contact pads, vias, etc. is very small. Defects formed during processing will rarely be large enough to cause an erroneous open or a short in the wafer conductors and wafer contact pads.

Unlike the first metal layer, the second metal layer is not used to form any of the circuitry on integrated circuit die 22. The second metal layer is an additional layer of metal which is deposited and patterned using conventional metallization processes after the circuitry on integrated circuit die 22 has been fully formed. In alternate embodiments of the present invention, this second metal layer can be formed of any sufficiently conductive material which can be selectively deposited, or deposited and etched using conventional techniques.

In one embodiment of the present invention, a projection printer or a proximity printer was used to pattern the second metal layer on semiconductor wafer 20. Thus the entire semiconductor wafer 20 was exposed at the same time using one mask for the entire wafer. In this embodiment of the present invention, the geometries of the wafer conductors and wafer contact pads 38 are very large (e.g. tens of microns) in comparison to the geometries of the circuitry on the integrated circuit die 22 (e.g. fractions of microns).

One particular example of the present invention will now be discussed. Referring to FIGS. 4 and 6–8, in one embodiment of the present invention, the steps up to and including the step illustrated in rectangle 133 used conventional semiconductor processing materials and procedures which did not need to be modified in order to practice the present invention. Although the masks used incorporated modifications for the present invention, (e.g. to form resistor 77), the processing procedures and parameters (e.g. thicknesses, temperatures, etc.) remained unchanged up to and including the step illustrated in rectangle 133.

In one embodiment of the present invention, the steps illustrated in rectangles 134–135 include the following steps. First, one thousand nanometers of phosphoro silicate glass (PSG) are deposited over the entire wafer using plasma enhanced chemical vapor deposition (PECVD). Then the PSG overlying a portion of the other dicing lane circuitry 70 (see FIG. 4), the PSG overlying the vias to second metal, such as vias 76, and the PSG overlying each mini-pad contact 80 are removed using conventional masking and etching techniques. A portion of the other dicing lane circuitry 70 is then tested using probe equipment.

Next, fifty-five hundred nanometers of polyimide are deposited over the entire wafer using conventional spin coating techniques. The polyimide overlying the dicing lanes (e.g. dicing lanes 34–37 in FIG. 2), overlying each mini-pad contact 80 (see FIG. 4), and overlying each bonding pad contact 79 is then removed by optically exposing and developing the polyimide using conventional techniques. The third insulating layer has now been deposited and subsequently removed from the selected areas.

In this same embodiment of the present invention, the step illustrated in rectangle 136 includes the following steps. Two thousand nanometers of aluminum alloy are deposited over the entire wafer using conventional sputtering techniques. In one embodiment, the aluminum alloy is approximately 98% aluminum, approximately 1% silicon, and approximately 1% copper. The aluminum alloy is then removed from selected areas using conventional photolithographic patterning and etching techniques. The aluminum ahoy is not used to form any of the circuitry within integrated circuit die 22.

In this same embodiment of the present invention, the step illustrated in rectangle 137 includes thorough reliability testing of all of the integrated circuit die 22 while the temperature of semiconductor wafer 20 is elevated to approximately one hundred twenty-five degrees centigrade for approximately six hours.

In this same embodiment of the present invention, the step illustrated in rectangle 138 includes the following steps. The portions of the second metal layer overlying the mini-pad contacts, such as mini-pad contact 80 (see FIG. 4), are masked using conventional photolithographic patterning techniques. Then the second metal layer is removed using conventional etching techniques. The purpose of masking the area overlying the mini-pad contacts (e.g. mini-pad contact 80) is to protect the first layer metal forming the bonding pads (e.g. bonding pad 78) and to protect the integrated circuit die 22 from the entry of contamination. The masking prevents the first layer metal forming the bonding pads from being partially etched or removed by the etching step used to remove the second layer metal.

In one embodiment of the present invention, the same conductive layer (e.g. second layer metal in FIGS. 4 and 5) which is used to form the majority of the wafer conductors may be used to program the non-volatile memory cells (not shown) in the identification code circuits (e.g. 67 and 68 in FIG. 3) on each integrated circuit die 22. The second layer metal used to program the non-volatile memory cells in the identification code circuits can then be masked and protected from the etch used to remove the second layer metal. The portion of second layer metal used to program the non-volatile memory cells can be protected from the second layer metal etch in the same manner as the portion of second layer metal overlying mini-pad contact 80.

Note that in an alternate embodiment of the present invention, PSG may be the only insulating material deposited for the third insulating layer; polyimide may not be used. Alternate embodiments of the present invention may use any appropriate insulating material or combination of insulating materials. Alternate embodiments of the present invention may use any appropriate conductive material or combination of conductive materials to form the wafer conductors and wafer contact pads 38.

Alternate embodiments of the present invention may use fewer, more, or different steps than those illustrated in FIGS. 6–8. For example, alternate embodiments of the present invention may use fewer, more, or different processing steps than those illustrated in FIGS. 6–8 to form the wafer conductors and to couple the wafer conductors to the integrated circuit die 22.

Figure 9:
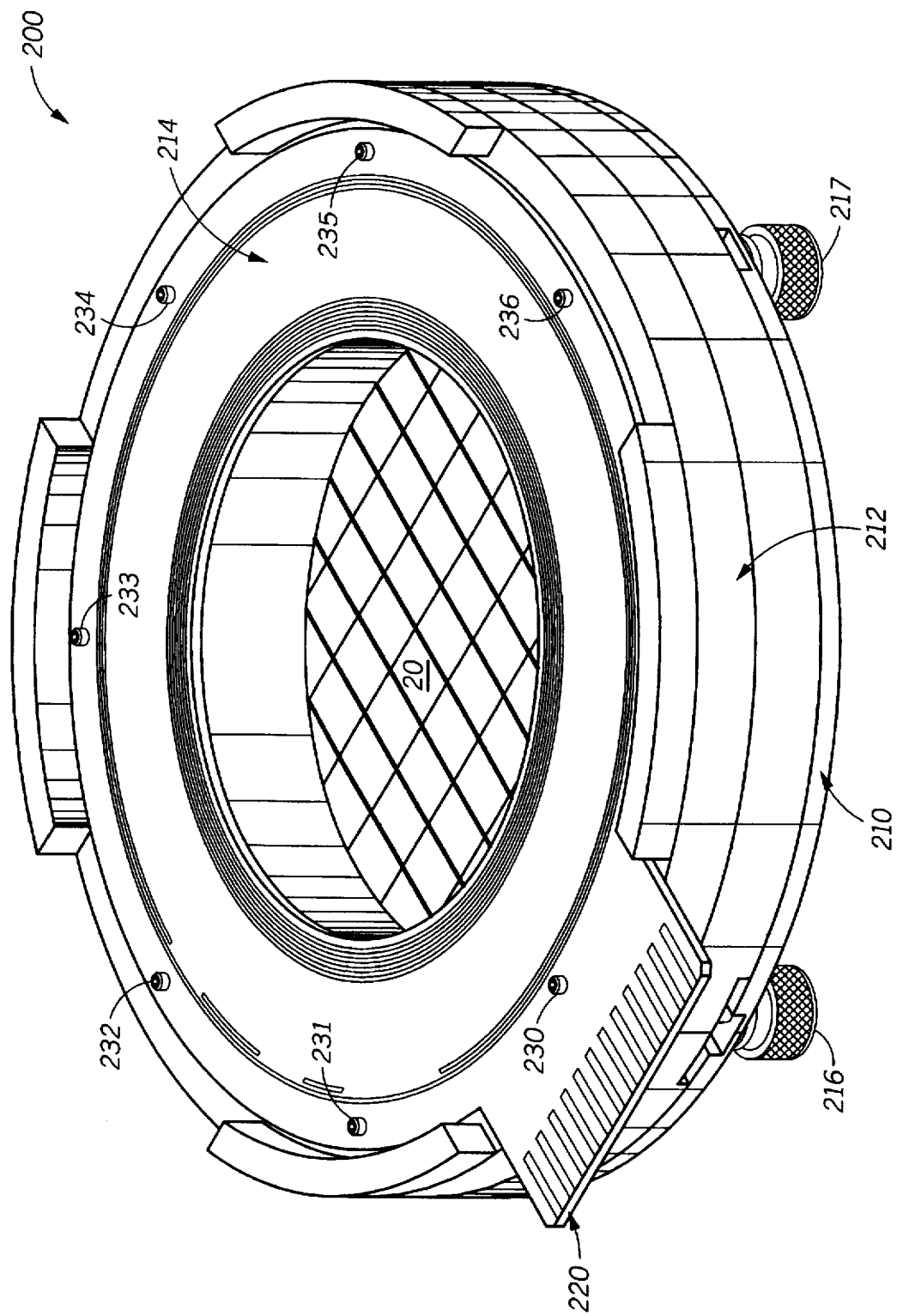
FIG. 9 illustrates a three-quarters view of an apparatus for performing wafer level testing in accordance with one embodiment of the present invention.
Figure 12:
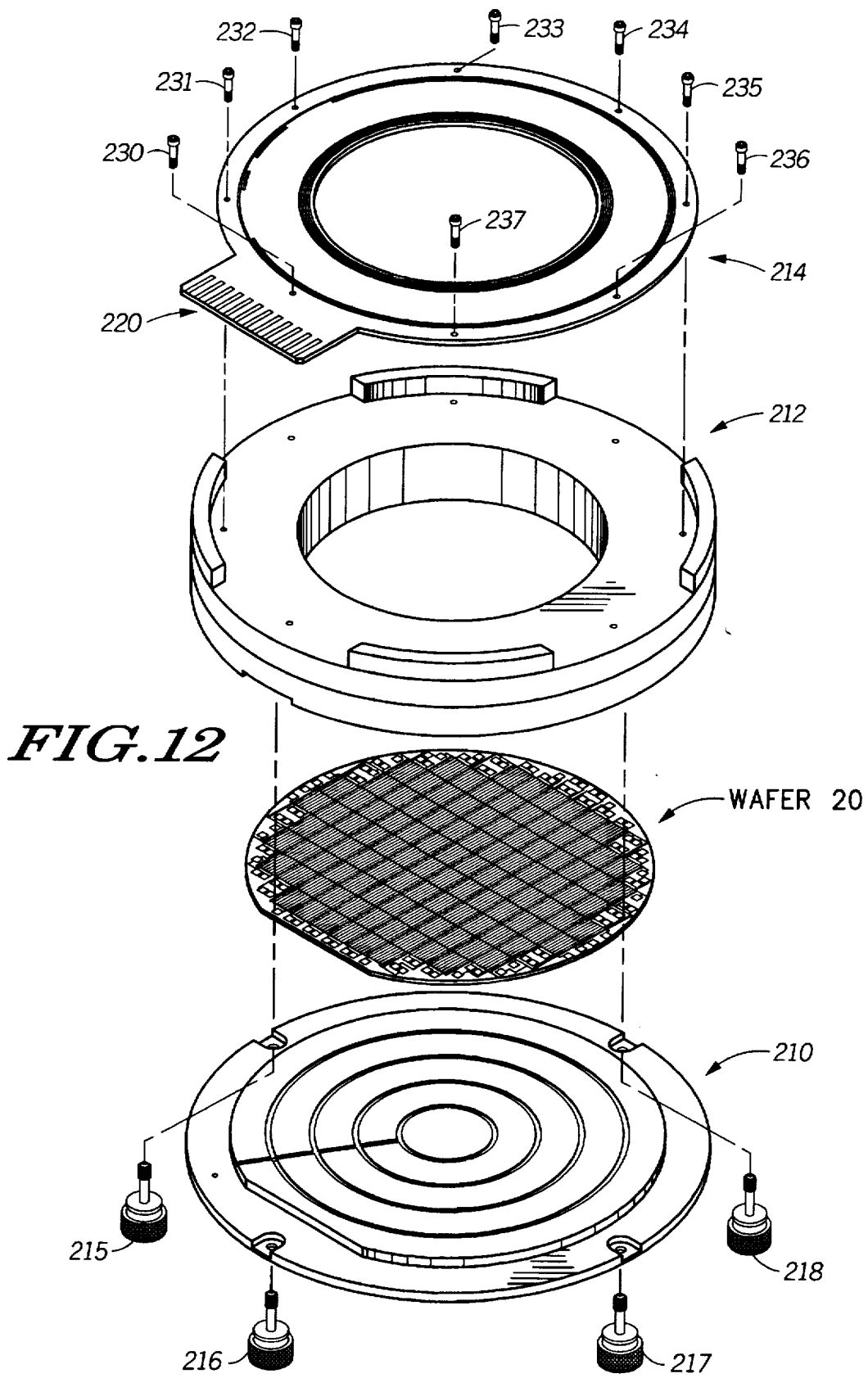
FIG. 12 illustrates a three-quarters, segmented view of the apparatus for performing wafer level testing of FIG. 9 in accordance with one embodiment of the present invention.

FIGS. 9–12 illustrate various views of an apparatus for performing wafer level testing in accordance with one embodiment of the present invention. FIG. 9 illustrates a test fixture 200 and a semiconductor wafer 20. Although FIG. 12 illustrates a view of test fixture 200 as it is used to perform wafer level burn-in, it is important to note that test fixture 200 is loaded upside down from the view illustrated in FIG. 12. That is, electrical connector board 214 is attached to top plate 212 and they are both flipped over. Then semiconductor wafer 20 is flipped over and placed against the bottom of top plate 212, with integrated circuit die 22 facing downward toward top plate 212.

Then bottom plate 210 is flipped over and the top of bottom plate 210 is placed against the bottom of semiconductor wafer 20. Screws 215–218 are then tightened to hold test fixture 200 together. Test fixture 200 can then be flipped back over so that screws 215–218 act as feet, as illustrated in FIG. 12. The wide, center opening in electrical connector board 214 and the wide, center opening in top plate 212 allow access to semiconductor wafer 20 during testing. For example, probe needles may make contact to wafer 20 through these openings.

Test fixture 200 will now be discussed in more detail. Top plate 212 has a leaf spring 247, a retaining screw 248, and a flat 249 which are used to align a semiconductor substrate such as wafer 20 (see cut-throughs in FIG. 10). Leaf spring 247 and retaining screw 248 are located so that they use the alignment point on the periphery of wafer 20 which is used during the processing steps for forming integrated circuit die 22. Wafer 20 is placed on top plate 212 such that wafer flat 21 of wafer 20 fits up against flat 249 of top plate 212. In one embodiment of the present invention, retaining screw 248 holds leaf spring 247 in place.

Bottom plate 210 may optionally have concentric grooves, which can be used in conjunction with vacuum fitting 243 (see FIG. 10) to allow a vacuum to be drawn to hold wafer 20 firmly in contact with bottom plate 210. In addition, back pressure can be applied to vacuum fitting 243 in order to separate wafer 20 from bottom plate 210.

In some embodiments, top plate 212 may be a solid plate; and in other embodiments, top plate 212 may be ring-shaped plate with a hole in the middle. An electrical connector board 214 is attached to top plate 212 by way of small screws 230–237. During normal usage of test fixture 200, electrical connector board 214 remains attached to top plate 212 by way of small screws 230–237. Electrical connector board 214 has a male edge connector 220 which can be used to transfer electrical signals to and from test fixture 200. Screws 215–218 are used to physically hold together bottom plate 210, wafer 20, and top plate 212. Screws 215–218 must be unscrewed in order to remove a first wafer 20 and to replace it with a second wafer 20 which is to be tested.

Figure 10:
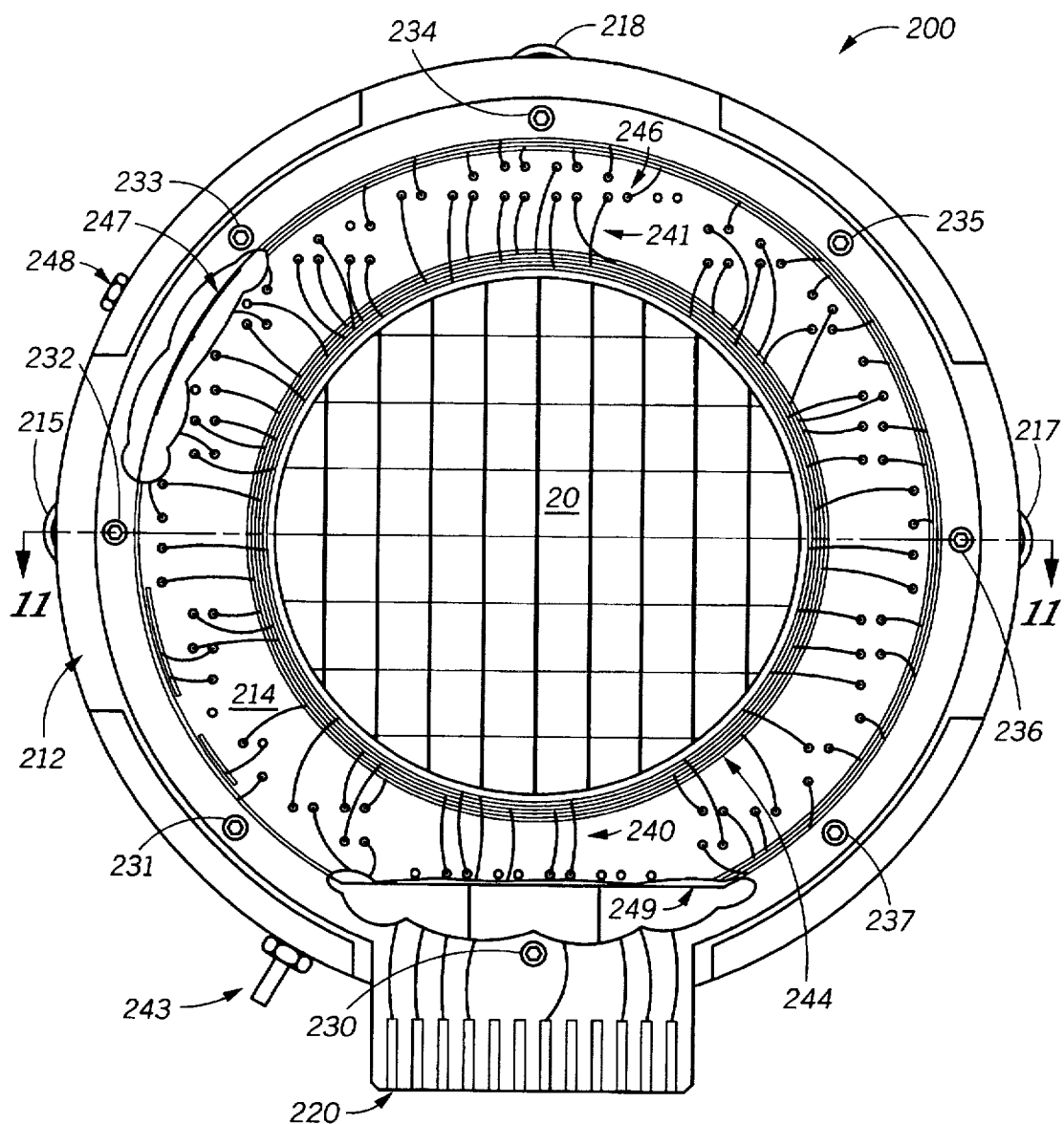
FIG. 10 illustrates a top view of the apparatus for performing wafer level testing of FIG. 9 in accordance with one embodiment of the present invention.
Figure 11:
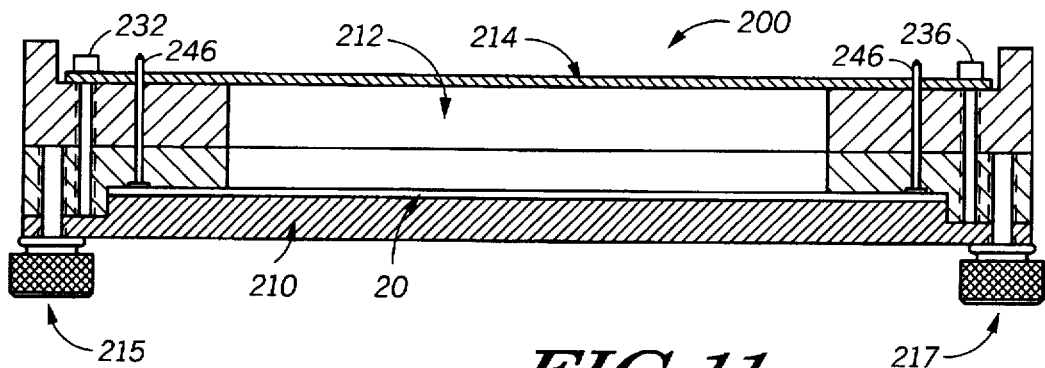
FIG. 11 illustrates a cross-sectional view of the apparatus for performing wafer level testing of FIG. 9 taken along the line 11—11 in accordance with one embodiment of the present invention.

Referring to FIG. 10, screwing down screws 215–218 causes pogo pins 246 to come in physical contact with the wafer contact pads 38 on wafer 20 (see FIG. 2). The illustrated embodiment of the present invention has a pogo pin 246 for each wafer contact pad 38. The physical placement of each pogo pin 246 in electrical connector board 214 corresponds to the physical placement of wafer contact pads 38 on wafer 20.

Each of the pogo pins 246 comes in physical contact with one of the wafer contact pads 38. As a result, each of the pogo pins 246 is electrically coupled to one of the wafer contact pads 38. Wires 241 (or printed circuit boards in an alternate form) electrically couple each pogo pin 246 to one of the conductors 244 on electrical connector board 214. Each of the conductors 244 on electrical connector board 214 is coupled to one of the conductors on male edge connector 220 by way of one or more wires 240. In alternate embodiments of the present invention, wires 240 and wires 241 may be implemented as conductors on a printed circuit board.

FIGS. 9–12 illustrate one embodiment of test fixture 200 and a semiconductor wafer 20. There are many alternate embodiments. For example, both the top plate 212 and the bottom plate 210 may be any shape. Although one embodiment of the present invention uses pogo pins 246 as conductive members to electrically couple test fixture 200 to the wafer contact pads 38 on wafer 20, any type of conductive members could be used.

In addition, bottom plate 210 may include or incorporate conductive members. For example, bottom plate 210 may have conductive members which electrically couple test fixture 200 to the bottom of wafer 20 in order to transfer a ground voltage level to integrated circuit die 22. In some embodiments of the present invention, the electrical coupling between test fixture 200 and the bottom of wafer 20 may be the only way in which integrated circuit die 22 receive a ground voltage level. In other embodiments of the present invention, the electrical coupling between test fixture 200 and the bottom of wafer 20 may be an additional way in which integrated circuit die 22 receive a ground voltage level.

In addition, bottom plate 210 may include or incorporate a different mechanism for receiving electrical signals. Male edge connector 220 is just one possible implementation. Any alternate mechanism which allows electrical signals to be transferred to test fixture 200 from external to test fixture 200 may be used. Although one embodiment of the present invention uses electrical connector board 214 to electrically couple the pogo pins 246 to edge connector 220, any type of electrical coupling could be used. In an alternate embodiment of the present invention, wafer 20 itself may be patterned with edge connector conductors so that a female edge connector may be physically coupled directly to wafer 20.

In one embodiment of the present invention, bottom plate 210 is made of a material having a high coefficient of thermal conductance, and wafer 20 is held in close physical contact with bottom plate 210 by way of a vacuum. As a result, the temperature variation between each integrated circuit die 22 on wafer 20 is reduced.

Although one embodiment of the present invention uses screws 215–218 to couple top plate 212 and bottom plate 210, any mechanism which allows wafer 20 to be held in a fixed position relative to pogo pins 246 may be used.

Figure 13:
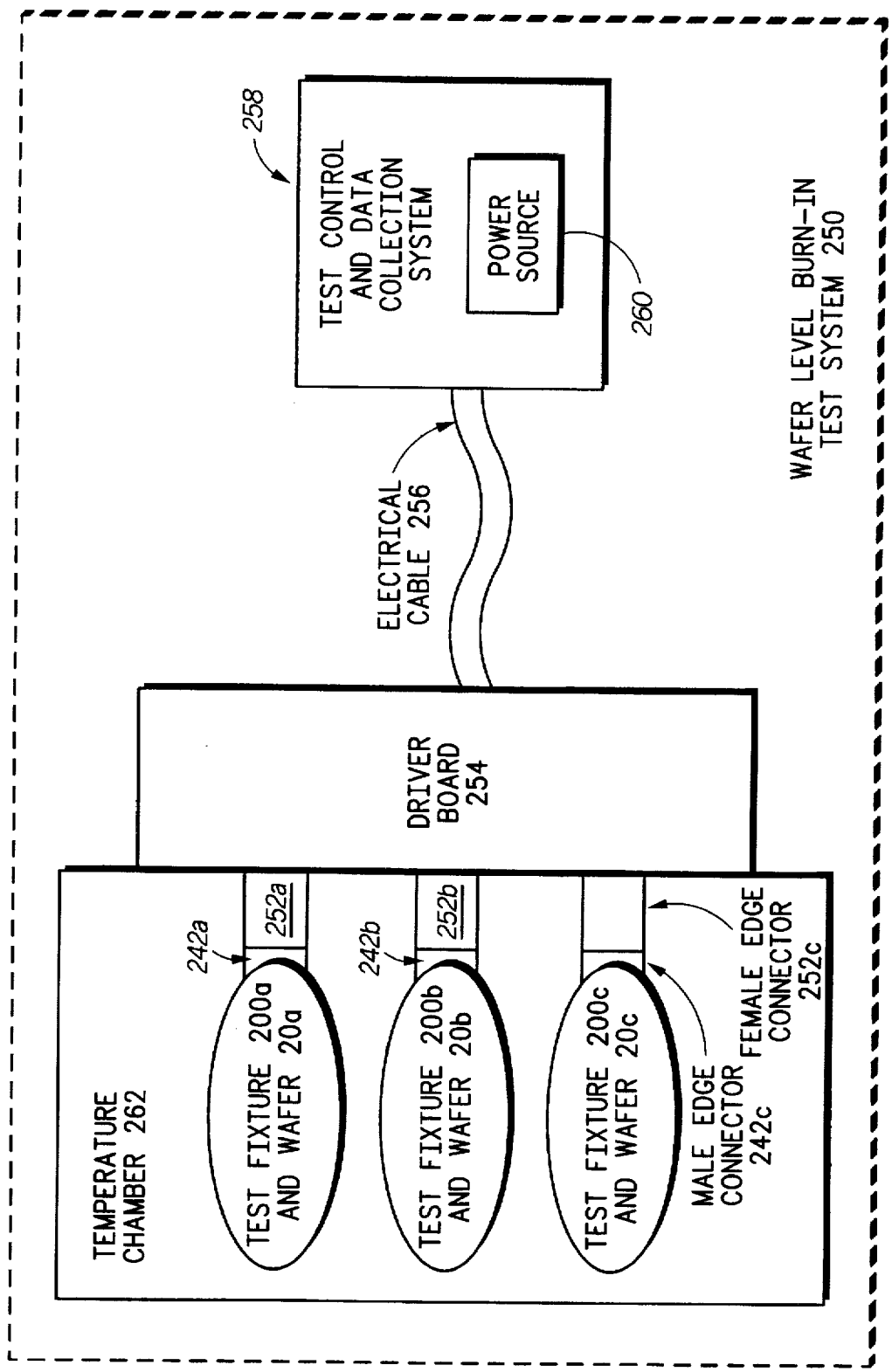
FIG. 13 illustrates, in block diagram form, a wafer level burn-in test system in accordance with one embodiment of the present invention.

FIG. 13 illustrates a wafer level burn-in test system 250 in accordance with one embodiment of the present invention. One or more test fixtures 200 and one or more semiconductor wafers 20 can be placed in temperature chamber 262. Although the embodiment of the present invention illustrated in FIG. 13 shows only three test fixtures and three wafers, namely test fixtures 200a, 200b, and 200c, and wafers 20a, 20b, and 20c, alternate embodiments of the present invention may use any size temperature chamber 262, and may place as few or as many test fixtures 200 and wafers 20 in temperature chamber 262 as desired.

In the embodiment of the present invention illustrated in FIG. 13, test fixture 200a has a male edge connector 242a which is physically and electrically connected to female edge connector 252a; test fixture 200b has a male edge connector 242b which is physically and electrically connected to female edge connector 252b; and test fixture 200c has a male edge connector 242c which is physically and electrically connected to female edge connector 252c. In one embodiment of the present invention, the female edge connectors 252a, 252b, and 252c are physically attached to an inside wall of the temperature chamber 262.

The conductors on the female edge connectors 252a, 252b, and 252c are electrically coupled to driver board 254. Driver board 254 is coupled to test control and data collection system 258 by way of electrical cable 256. Test control and data collection system 258 includes a power source 260 which can be used to supply selected voltage levels to wafers 20a–20c.

In the illustrated embodiment of the present invention, test control and data collection system 258 transfers voltage level signals such as power and ground to each integrated circuit die 22 on each wafer 20a–20c. For example, in one embodiment of the present invention, power source 260 supplies three voltage levels to each integrated circuit die 22 on each wafer 20a–20c, namely a ground supply voltage level, a standard power supply voltage level, and a high voltage power supply voltage level.

In one embodiment of the present invention, the integrated circuit die 22 are data processors which have on-board EEPROM (electrically erasable programmable read only memory). For example, referring to FIG. 3, integrated circuit die 28 may have an EEPROM circuit 81 and integrated circuit die 29 may have an EEPROM circuit 82.

The high voltage power supply voltage level is required in order to properly program, and thus in order to test, the on-board memory. In alternate embodiments of the present invention, power source 260 may supply fewer, more, or different voltage level signals to each integrated circuit die 22 on each wafer 20a–20c.

In addition, test control and data collection system 258 transfers one or more test related signals to each integrated circuit die 22 on each wafer 20a–20c. For example, in one embodiment of the present invention, test control and data collection system 258 supplies a reset signal, a clock signal, and a data signal to each integrated circuit die 22 on each wafer 20a–20c. In alternate embodiments of the present invention, test control and data collection system 258 may supply fewer, more, or different test related signals to each integrated circuit die 22 on each wafer 20a–20c.

Some embodiments of the present invention may not require the use of a temperature chamber 262. Instead, heat strips (not shown) for generating heat may be attached to bottom plate 210.

The present invention may use various testing techniques to test integrated circuit die 22 on one or more wafers 20 simultaneously. Although one embodiment of the present invention uses three test signals and three voltage signals to test integrated circuit die 22 on one or more wafers 20 simultaneously, alternate embodiments of the present invention may use fewer, more, or different signals. Generally, however, most testing techniques will use at least a power signal, a ground signal, and a test initiation signal such as reset.

It is generally desirable in the present invention to use a testing technique which does not require access to all of the signals which are internally coupled to one or more bonding pads on integrated circuit die 22. For example, the thorough electrical testing which is performed on packaged integrated circuit die in the prior art uses a test apparatus which is normally electrically coupled to every integrated circuit pin, and thus every bonding pad on each integrated circuit die 22. In the present invention, however, it is generally desirable to reduce the number of signals which must be used to test integrated circuit die 22. Reducing the number of signals used to test integrated circuit die 22 reduces the number of separate wafer conductors which must be routed around each wafer 20.

One embodiment of the present invention uses a built-in-self-test (BIST) capability which is incorporated into each integrated circuit die 22. The present invention may use any of a number of built-in-self-test testing techniques which are well known in the art. Most built-in-self-test testing techniques require only a small number of signals which must be transferred to and/or from the integrated circuit.

For example, the MC68HC11 microcontroller (available from Motorola, Inc. of Austin, Tex.) has a bootstrap mode which can be used in conjunction with a serial communication interface to perform a built-in-self-test. The MC68HC11 bootstrap mode requires that the self-test software be loaded into the on-board random access memory (RAM) by means of the serial communication interface. Thus the MC68HC11 microcontroller is a data processor which has the capability to perform self-tests with only a few bonding pads coupled external to the data processor for receiving or transferring signals. Thus only a few wafer conductors would be required to perform wafer level testing of the MC68HC11 microcontroller.

The Intel 80486 microprocessor (available from Intel, Corp. of Santa Clara, Calif.) has a built-in-self-test capability which allows it to perform a built-in-self-test without the need for transferring any software. Thus the Intel 80486 microprocessor would require even fewer signals than the MC68HC11 bootstrap mode. There are other data processors which also have the capability to perform self-tests with only a few bonding pads coupled external to the data processor for receiving or transferring signals. For the data processors which have this self-test capability, only a few wafer conductors are required in order to test the individual data processor integrated circuit die while they are still in wafer form.

In one embodiment of the present invention, integrated circuit die 22 are data processors having on-board EEPROM 81, 82 (see FIG. 3). The EEPROM may be used to store test result information. For example, the EEPROM can be used to store information regarding whether or not the integrated circuit die 22 passed or failed a built-in-self-test. In addition, if a failure occurred, one or more bytes of the EEPROM can be used to store more detailed information regarding the failure. For example, the EEPROM could be used to store information regarding the testing of the EEPROM itself. The EEPROM could store information regarding which portion of the test failed, which location or locations failed, whether or not the failure was a data retention failure, which write/erase cycle failed, etc.

A simple probe operation can be performed on the portion of the EEPROM used to store the test result information on each integrated circuit die 22. The probe operation can be used in order to determine whether or not each integrated circuit die 22 passed or failed the built-in-self-test.

Referring to FIG. 13, one embodiment of the present invention uses a built-in-self-test testing techniques which requires six signals, and thus six separate wafer conductors on each wafer 20. In one embodiment of the present invention, the six signals include a power supply high voltage level signal, a data signal, a reset signal, a clock signal, a power supply memory programming voltage level signal, and a power supply ground voltage level signal. Due to the higher currents they must conduct, the wafer conductors which are used to transfer power supply voltage levels are generally formed using wider conductors than the wafer conductors which are used to transfer test signals.

Referring to the power supply high voltage level signal, in one embodiment of the present invention, a power supply high voltage level signal is transferred from power source 260 to each integrated circuit die 22 on wafers 20a–20c. Referring to FIG. 2, wafer contact pad 54, and possibly one or more redundant wafer contact pads, receive this power supply high voltage level signal. This power supply high voltage level signal is then transferred to each individual integrated circuit die 22 by way of a wafer conductor.

A portion of the wafer conductor transferring the power supply high voltage level signal may overlie one or more integrated circuit die 22. Referring to FIG. 2 and FIG. 3, in one embodiment of the present invention, the wafer conductor transferring the power supply high voltage level signal includes vertical conductor 42 and a horizontal conductor (not shown) which is located in the horizontal dicing lane adjacent to horizontal dicing lane 34 (in the direction away from wafer flat 21). Note that in one embodiment of the present invention, two horizontal conductors are formed in each horizontal dicing lane. Alternate embodiments of the present invention may form a different number of horizontal conductors in each horizontal dicing lane.

In some embodiments of the present invention there are six signals to be transferred for testing purposes. In one of these embodiments, every sixth horizontal conductor will be included as a portion of the wafer conductor which is transferring the power supply high voltage level signal. Likewise, every sixth vertical conductor will be included as a portion of the wafer conductor which is transferring the power supply high voltage level signal.

In an alternate embodiment of the present invention, extra vertical conductors are used for the signals transferring power and ground. For example, an integrated circuit die 22 may have eight overlying vertical conductors, where two of the eight vertical conductors are transferring a power signal and a different two of the eight vertical conductors are transferring a ground signal. Note that some of the horizontal conductors and some of the vertical conductors may be located in the dicing lanes rather than overlying the integrated circuit die 22.

Referring to the data signal, in one embodiment of the present invention, a data signal is transferred from test control and data collection system 258 to each integrated circuit die 22 on wafers 20a–20c. Referring to FIG. 2, wafer contact pad 55, and possibly one or more redundant wafer contact pads, receive this data signal. This data signal is then transferred to each individual integrated circuit die 22 by way of a wafer conductor.

A portion of the wafer conductor transferring the data signal may overlie one or more integrated circuit die 22. Referring to FIG. 2 and FIG. 3, in one embodiment of the present invention, the wafer conductor transferring the data signal includes vertical conductor 43 and horizontal conductor 53.

In some embodiments of the present invention there are six signals to be transferred for testing purposes. In one of these embodiments, every sixth horizontal conductor will be included as a portion of the wafer conductor which is transferring the data signal. Likewise, every sixth vertical conductor will be included as a portion of the wafer conductor which is transferring the data signal.

Referring to the reset signal, in one embodiment of the present invention, a reset signal is transferred from test control and data collection system 258 to each integrated circuit die 22 on wafers 20a–20c. Referring to FIG. 2, wafer contact pad 56, and possibly one or more redundant wafer contact pads, receive this reset signal. This reset signal is then transferred to each individual integrated circuit die 22 by way of a wafer conductor.

A portion of the wafer conductor transferring the reset signal may overlie one or more integrated circuit die 22. Referring to FIG. 2 and FIG. 3, in one embodiment of the present invention, the wafer conductor transferring the reset signal includes vertical conductor 44 and horizontal conductor 51.

In some embodiments of the present invention there are six signals to be transferred for testing purposes. In one of these embodiments, every sixth horizontal conductor will be included as a portion of the wafer conductor which is transferring the reset signal. Likewise, every sixth vertical conductor will be included as a portion of the wafer conductor which is transferring the reset signal.

Referring to the clock signal, in one embodiment of the present invention, a clock signal is transferred from test control and data collection system 258 to each integrated circuit die 22 on wafers 20a–20c. Referring to FIG. 2, wafer contact pad 57, and possibly one or more redundant wafer contact pads, receive this clock signal. This clock signal is then transferred to each individual integrated circuit die 22 by way of a wafer conductor.

A portion of the wafer conductor transferring the clock signal may overlie one or more integrated circuit die 22. Referring to FIG. 2 and FIG. 3, in one embodiment of the present invention, the wafer conductor transferring the clock signal includes vertical conductor 45 and horizontal conductor 52.

In some embodiments of the present invention there are six signals to be transferred for testing purposes. In one of these embodiments, every sixth horizontal conductor will be included as a portion of the wafer conductor which is transferring the clock signal. Likewise, every sixth vertical conductor will be included as a portion of the wafer conductor which is transferring the clock signal.

Referring to the power supply memory programming voltage level signal, in one embodiment of the present invention, a memory programming voltage level signal is transferred from power source 260 to each integrated circuit die 22 on wafers 20a–20c. Referring to FIG. 2, wafer contact pad 58, and possibly one or more redundant wafer contact pads, receive this memory programming voltage level signal. This memory programming voltage level signal is then transferred to each individual integrated circuit die 22 by way of a wafer conductor.

A portion of the wafer conductor transferring the memory programming voltage level signal may overlie one or more integrated circuit die 22. Referring to FIG. 2 and FIG. 3, in one embodiment of the present invention, the wafer conductor transferring the memory programming voltage level signal includes vertical conductor 46 and horizontal conductor 50.

In alternate embodiments of the present invention, one or more additional voltage level signals, aside from power and ground, may be used. A memory programming voltage level signal is merely one example. Other examples are an analog-to-digital converter reference voltage signal, a high or low voltage mode select signal, a supply voltage signal for a voltage regulator, and a high voltage signal for non-volatile memory stress and/or margin tests. Alternate embodiments of the present invention may use one or more high or low voltage signals for testing circuitry on integrated circuit die 22.

In some embodiments of the present invention there are six signals to be transferred for testing purposes. In one of these embodiments, every sixth horizontal conductor will be included as a portion of the wafer conductor which is transferring the memory programming voltage level signal. Likewise, every sixth vertical conductor will be included as a portion of the wafer conductor which is transferring the memory programming voltage level signal.

Referring to the power supply ground voltage level signal, in one embodiment of the present invention, a ground voltage level signal is transferred from power source 260 to each integrated circuit die 22 on wafers 20a–20c. Referring to FIG. 2, wafer contact pad 59, and possibly one or more redundant wafer contact pads, receive this ground voltage level signal. This ground voltage level signal is then transferred to each individual integrated circuit die 22 by way of a wafer conductor.

A portion of the wafer conductor transferring the ground voltage level signal may overlie one or more integrated circuit die 22. Referring to FIG. 2 and FIG. 3, in one embodiment of the present invention, the wafer conductor transferring the ground voltage level signal includes vertical conductor 47 and a horizontal conductor (not shown) which is located in the horizontal dicing lane adjacent to horizontal dicing lane 34 (in the direction away from wafer flat 21).

In some embodiments of the present invention there are six signals to be transferred for testing purposes. In one of these embodiments, every sixth horizontal conductor will be included as a portion of the wafer conductor which is transferring the ground voltage level signal. Likewise, every sixth vertical conductor will be included as a portion of the wafer conductor which is transferring the ground voltage level signal.

In one embodiment of the present invention, the power supply high voltage level signal and the power supply ground voltage level signal are used to supply power and ground to integrated circuit die 22. The power supply memory programming voltage level signal is used to supply a high voltage level used to program and/or erase non-volatile memory such as EPROM, flash EPROM, or EEPROM. The reset signal is used to place each of the integrated circuit die 22 in a predetermined reset state. The data signal is be used by the test control and data collection system 258 to initiate the built-in-self-test procedure on each integrated circuit 22. The data signal may also be used by the integrated circuits 22 to indicate that the built-in-self-test procedure has been completed.

Alternately, the data signal may be used to transfer instructions from the test control and data collection system 258 to each integrated circuit die 22. These instructions may then be used by each integrated circuit die 22 to initiate particular tests. In addition, the data signal may be used to transfer information from each integrated circuit die 22 to the test control and data collection system 258. This information can then be used to determine which integrated circuit die 22 failed one or more tests, and which tests were failed by which integrated circuit die 22.

Burn-in testing can also be performed using a wafer level burn-in test system 250 such as that illustrated in FIG. 13. Burn-in testing involves the testing of integrated circuit die 22 for an extended period of time while the temperature of the integrated circuit die 22 is elevated above room temperature. In some cases, the heat generated by the integrated circuit die 22 itself is sufficient to elevate the temperature of the integrated circuit die 22. In other cases, the temperature of the integrated circuit die 22 is raised by placing the integrated circuit die 22 in temperature chamber 262 and elevating the temperature. Alternately, test fixture 200 itself may incorporate a heating element (not shown) which can elevate the temperature of the integrated circuit die 22.

Alternately, instead of, or in addition to burn-in testing, cold temperature testing may be performed. Cold temperature testing involves the testing of integrated circuit die 22 for an extended period of time while the temperature of the integrated circuit die 22 is decreased below room temperature. The temperature of the integrated circuit die 22 is decreased by placing the integrated circuit die 22 in temperature chamber 262 and decreasing the temperature.

FIG. 14 illustrates an integrated circuit wafer containing a plurality of integrated circuit (IC) die 502. When the die 502 are manufactured on the semiconductor wafer 500, scribe lines 504 and 506 are horizontally formed between integrated circuits to space the die vertically from one another. In addition, vertical scribe lines 508 and 510 are positioned adjacent each integrated circuit die to space the die horizontally from one another. The wafer flat 512 is used to physically align and identify the wafer 500 of FIG. 14. FIG. 14 illustrates a subgroup of integrated circuits labeled subgroup 514. Subgroup 514 is a one by four (1×4) array of integrated circuits. In this array, a plurality of test contact pads are formed overlying the active circuitry of the integrated circuit as illustrated in FIG. 14 and further illustrated in more detail in FIG. 15. The test contact pads can be contacted via pogo pins, probe needles, or the like as taught herein. Subgroup 514 contains six physically disjoined busses which are interconnected across each of the four integrated circuit die of subgroup 514. The six signals carried by each of these busses include VDD, VPP, VSS, a data input, a clock signal, and a reset signal. Other signals or fewer signals are possible in other embodiments or for different ICs.

The subgroup 514 is formed by an integrated circuit stepper machine which is a photolithographic piece of equipment. An integrated circuit consists of a plurality of conductive layers and a plurality of dielectric layers overlying a substrate. In order to form the conductive layers and interconnects between conductive layers, a plurality of masks are used. Each mask defines a physical two-dimensional structure to at least one specific physical layer of material on the IC. This physical structure is to be patterned on to the integrated circuit substrate by lithographic techniques. By positioning these masks one at a time in a time sequential manner over the integrated circuit substrate and exposing the substrate to light selectively through the masks, integrated circuits are formed on a wafer wherein each layer has a potentially different physical geometry or arrangement. When using a stepper, the stepper positions a mask over a predetermined first area of the wafer and exposes the substrate in that area to the selective (masked) light source. After exposure of the first area, the stepper moves to a new unexposed second area of the wafer and typically aligns its position using alignment marks to the first area. After alignment, the mask is used to expose the unexposed second area to make an additional patterned area in addition to the first area. The integrated circuit stepper "steps" (via X-Y movement and alignment) and selectively exposes light sequentially across the entire wafer until the entire wafer has been processed from unexposed areas to processed areas.

In the illustration of FIG. 14, the stepper contains a mask (also known as a reticle) that contains four integrated circuits in a one by four (1×4) array pattern. Therefore, instead of stepping one integrated circuit at a time, which is possible, the wafer 500 of FIG. 14 is stepped in groups of four integrated circuits at a time. It is important to note that a stepper can pattern, in a single reticle, one integrated circuit die or a plurality of integrated circuit die in any array format (1×2, 3×2, 4×4, etc.). The plurality of integrated circuit die can be arranged on a reticle or a mask in any two-dimensional array. In general, the reticle can contain a plurality of integrated circuit die arranged in an array of N by M, wherein N and M are independent integers.

Each time a reticle and IC is exposed to light via the stepper, a layer of material is geometrically constrained or defined on the IC. After all masks have been time sequentially exposed over the wafer in a stepped manner, a plurality of completed, but unpackaged, integrated circuits are formed on the substrate 500. In FIG. 14, exposing light through a reticle will define a layer, vias, or a like structure in parallel for four integrated circuits at a time as illustrated in subgroup 514. Subgroup 514 contains test wafer pads and six busses which are not coupled to any other subgroup or reticle set. Each reticle set has its own bus structure of six busses which are isolated/disjoined from all other bus structures for the other reticles.

In some cases, a row of integrated circuit die will contain a number of die not readfly divisible by the reticle size. For example, the top row of FIG. 14 contains a total of six integrated circuit die. Using a one by four (1×4) reticle, it is trivial to form rows that contain 4×N integrated circuits wherein N is an integer (e.g., rows with 4, 8, 12, 16, 20, 24 integrated circuits in the row). When the row is to contain a number other than 4×N integrated circuits, special processing is required (e.g., rows containing 3, 13, 26, or 41 ICs). There are two special processing techniques which can be used to form a "non-multiple of N" row of ICs on a wafer using M×N reticles.

In FIG. 14, a first method would form subgroup 514 using a first reticle and then form subgroup 516 using a second reticle. In other words, the first reticle is a mask containing a one by four (1×4) array of integrated circuits whereas the second reticle is a reticle containing a one by two (1×2) array of integrated circuits. The switching of these reticles is performed on the fly by the stepper, and therefore the stepper must be capable of containing more than one reticle at a time and switching between reticles in mid-process of a wafer.

The second method used to handle non-multiple numbers of die in a row is to use the left most two die of subgroup 514 to form the two die subgroup 516. This is called "blading." In other words, the reticle used to form 514 is moved to the right where the rightmost two integrated circuits of the 1×4 mask/reticle used to form 514 are positioned over area 516. Blading is then used to keep the left-most integrated circuits in 514 from being patterned on the wafer and only the right-most two integrated circuits of the pattern 514 are placed in the region 516. Blading is when an opaque or black region is positioned over the left-most two IC portion of the 1×4 reticle when exposing the subgroup 516. The opaque or black region prevents light which is selectively allowed through the right-most portion of the 1×4 reticle from impinging upon the wafer through the left-most portions of the reticle. By using the right most portion of the reticle, the buses of the last non-multiple die in the row which were patterned via the blading are coupled to the previous patterned die that were patterned by using an entire reticle with no blading. Therefore, when blading, using a 1×4 reticle, a bus that spans 5, 6, or 7 ICs in a row will be possible. Either of these two techniques can be used to form a row having a non-multiple number of integrated circuit die when compared to the reticle. Left and right can be interchanged depending upon stepper direction.

FIG. 14 illustrates via a subgroup 518 that any method and manner of routing wafer level pads and busses is possible. Even though the buses are formed in a top layer of metal, cross-under and cross-over structures can be formed in the scribe lines to allow the top layer of busses to be better routed in an efficient manner. The cross-under and cross-over structures connect the top level of metal to lower level metal or polysilicon under the top level metal. The lower level metal or polysilicon used in the cross-over and cross-under processing is not connected onto the IC functional circuit area but is located and confined to the scribe line area.

FIG. 15 illustrates the subgroup 514 of FIG. 14 in more detail. FIG. 15 illustrates the four integrated circuits of subgroup 514 of FIG. 14. These four integrated circuits are arranged in a one by four (1×4) array and labeled as integrated circuits 548 through 551. FIG. 15 also illustrates horizontal and vertical scribe lines which separate the integrated circuit die 548 through 551. Each integrated circuit 548 through 551 is formed having four pads overlying it. In another embodiment, another number of pads other than four can overlie each IC, and each IC may have different number of pads overlying it when in the same reticle. These four pads over each die are the pads that are contacted by the pogo pins or probe lines of a test apparatus similar to that illustrated in FIGS. 9 through 12. The only difference is that the test apparatus element 214 of FIGS. 9–10 must contain more than a peripheral ring of pogo pins. The element 214 should contain a solid two-dimensional array of pins covering the entire wafer.

Integrated circuit 548 contains overlying pads 531 through 534. Integrated circuit 549 contains overlying pads 535 through 538. Integrated circuit 550 contains overlying pads 539 through 542. Integrated circuit 551 contains overlying pads 543 through 546. The pads 531 through 546 directly overlie active circuits formed within the integrated circuits 548 and 551 and at least lie within a periphery of the active circuits circumference of the ICs. In another form, area directly underlying the pads 531 through 546 may be void of active circuitry to improve reliability. In other words, the pads 531–534, for example, are overlying no active circuitry but are within the periphery of the IC. This means that some portions of the IC substrate which will underlie the subsequently formed pads 531–534 are left void of active circuitry, although this is not necessary for many integrated circuit products.

FIG. 15 illustrates six busses (sub-buses) labeled 520 through 530. These busses are only coupled to the integrated circuits of subgroup 514 and all other subgroups on the wafer 500 have a different set of identically-routed busses not coupled to subgroup 514. Sub-bus 520 is coupled to the pins 531, 537, and 543. Sub-bus 522 is coupled to pins 535 through 531. Sub-bus 524 is coupled to pins 533, 539, and 541. Sub-bus 526 is coupled to pad 534, 540, and 546. Sub-bus 528 is coupled to pads 536 and 542. Sub-bus 530 is coupled to pads 532, 538, and 544. Each of the six sub-busses are isolated from one another in the top layer of metal since they carry different signals in a preferred embodiment. Each of the six busses are connected through a resistor to one or more bonding pads of the active circuitry contained within the ICs 548 through 551. Each bonding pad coupled to one of the busses 520–530 has its own resistor to avoid short circuiting the bus or aid in the situation where the bonding pad draws to much current due to a design defect or manufacturing defect. Only integrated circuit 548 is illustrated as having contacts between bonding pads and resistors in FIG. 15 for ease of illustration, and it should be noted that all ICs are coupled to each of the six busses in a similar fashion. In FIG. 15, the pads 531–546 are illustrated in a non-symmetrical manner (i.e., that a pogo-pin contact pad of one die can be in a different location from another die in a reticle cluster), and it should be noted that a symmetrical pattern for the pads 531–546 may also be advantageous (i.e., similar signal pads all located in the same die region of each die in a reticle).

Each bus 520 through 530 in FIG. 15 can be coupled multiple times to an integrated circuit through multiple resistors. FIG. 15 only illustrates that each bus is coupled to integrated circuit 548 through a single resistor for ease of illustration. Therefore, FIG. 15 illustrates that each bus is associated with at least one resistor and therefore, a minimum of six resistors 562 through 568 are illustrated as being coupled to integrated circuit 548 in FIG. 15. Resistor 562 is further discussed to understand the structure of the resistors used in FIG. 15. The resistors can be further understood via previous figures. The busses 520 through 530 are formed on a top-most layer of metal. In FIG. 15, the top-most layer of metal is a second layer of metal. Therefore, since the busses 520 through 530 are formed on a second layer of metal a layer of metal underlies it, which is referred to as a first layer of metal. Underneath the metal layers are other conventionally formed conductive or semiconductive layers such as one or more layers of polysilicon, silicided Si layers, or amorphous silicon. An understanding of this vertical stacking of conductive layers is important when understanding how the polysilicon resistors are connected in the scribe lines.

Resistor 562 is formed by contacting the second level metal bus 530 through a via 552 to the first layer of metal. The first layer of metal is then connected through a contact 554 to a polysilicon region 556. The polysilicon region is doped with dopant atoms such as boron, phosphorous, or arsenic to form a resistor of a fixed or predetermined resistance. A contact 558 is used to contact the polysilicon resistor layer 556 to metal one (the first layer of metal). The first layer of metal is then coupled through a via 560 to a metal two (second level of metal) region 561. The metal two region 561 is then coupled through a via 559 to a bonding pad of the integrated circuit 548. Therefore, any signal carried by bus 530 is propagated through resistor 556 to the integrated circuit through the via 559. The electrical signal is provided to the bus 530 by making probe or pin contact to one or more of the pads 532, 538, or 544.

In summation, the present invention can be used to perform wafer level burn-in testing of integrated circuit die. By performing reliability testing on integrated circuit die while in wafer form, semiconductor manufacturers can detect and screen out potentially all defective die right after the die have been manufactured, rather than after costly packaging has been performed. In addition, by performing reliability testing on integrated circuit die while in wafer form, semiconductor manufacturers can meet the requirements of multi-chip module (MCM) manufacturers by supplying "known good die".

In addition, by using built-in-self-test (BIST), the present invention allows some parametric testing and some functional testing, including burn-in reliability testing, to be performed while the integrated circuit die 22 (FIG. 2) are still in wafer form. Thus, for some integrated circuit die 22, it may be possible to entirely eliminate all probe testing using very cosily probe equipment. In addition, for some integrated circuit die 22, it may be possible to entirely eliminate the testing which must be performed on packaged integrated circuits using very cosily test equipment.

In one form, one may use the apparatus, methods, and wafer structure taught in FIGS. 1–13. This method is fine for many ICs whereas the teachings of FIGS. 14–15 are better suited to ICs which have larger wafer sizes, high power ratings, or are high performance microprocessors/memories/ICs. This is because FIGS. 14–15 unlike FIGS. 1–13 teach a method for forming the wafer having sub-buses where a small group of die share individual and disjoined buses from all other die on the wafer (FIG. 14) as opposed to the whole wafer sharing a bus over all die (FIG. 2). In addition, the pads of the buses (like pads 531–546 of FIG. 15) overlie the die unlike the pads of FIG. 2. Therefore, the embodiment of FIGS. 14–15 is improved over the embodiments of FIG. 1–13 in that: (1) the sub-busses allow for better power distribution with less voltage-drop problems; (2) the sub-busses, since they carry less current by not supplying the entire wafer as in FIG. 2, can be formed thinner than busses in the embodiment of FIG. 2, thereby making routing easier; (3) by having the pads overlie the die, a projection printer as in FIG. 2 is not required thereby reducing cost, increasing throughput and saving valuable floor-space in fabrication facilities; (4) allow for higher speed testing and allow ICs operating at a higher speed to be tested accurately; and (5) allows the methods taught herein to be more efficiently used to test wafers having sizes greater than 5" in diameter (many state of the art wafers are 12"). In performing wafer level testing of integrated circuit die, the present invention utilizes wafer conductors which are formed at least partially overlying the integrated circuit die themselves. By using the wafer conductors to transfer signals to, and possibly from, the integrated circuit die, it is possible to electrically test and burn-in the integrated circuit die in wafer form.

One embodiment of the present invention has six separate wafer conductors for transferring six different test signals; and each of the six wafer conductors includes a plurality of horizontal conductors and a plurality of vertical conductors. Alternate embodiments of the present invention can couple wafer conductors to all, some, or only a few of the bonding pads on each integrated circuit die. Some embodiments of the present invention use built-in-self-test capabilities which are incorporated into each individual integrated circuit die. In addition, any number of wafer conductors or busses/sub-busses can be used herein (e.g. ten busses or three busses instead of six as illustrated herein).

By allowing wafer conductors to be formed overlying the integrated circuit die, the entire area of a semiconductor wafer is now available for the routing of wafer conductors for wafer level testing. The present invention can still make use of the unused periphery of the die and the narrow dicing lanes; but in addition, the present invention can use the area overlying the integrated circuits, which is the vast majority of the area on most wafers.

Note also that the term resistor is used herein. It is well known that diodes, transistors, and almost all components comprise some resistive element. Any of these devices can be used as a "resistor" in FIG. 15 as long at it has some appropriate level of resistance. The resistor just needs to have enough resistance to avoid a shorted die from reducing or adversely altering the bus voltage.

Figure 16:
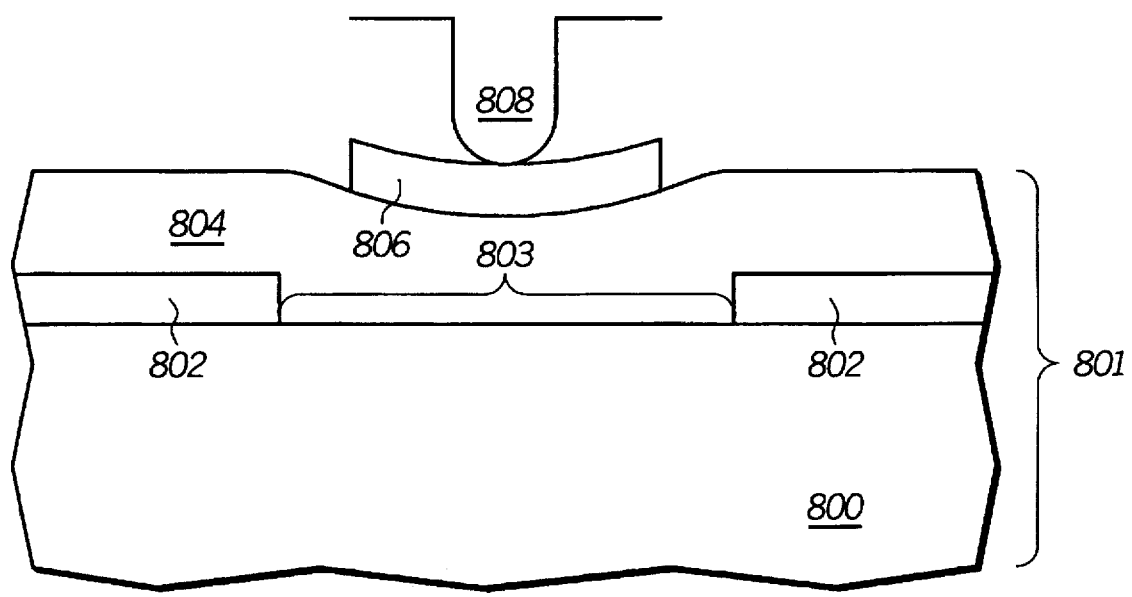
FIG. 16 illustrates, in a cross-sectional diagram, a cross-section of an IC that contains active area regions and non-active area regions in response to where pogo pin contacts pads are to be placed in accordance with the present invention.

FIG. 16 illustrates a cross-section of an integrated circuit die 801 formed on the wafer 500. IC die 801 has a substrate 800. The IC 801 contains areas on the substrate which contain active circuitry areas 802 containing elements such as capacitors, resistors, transistors, logic gates, and the like. An area 803 is an area that contains no active circuitry. A dielectric layer 804 is a top-most dielectric layer of the IC 801. On top of the dielectric layer 804 is a contact pad 806. Contact pad 806 is equivalent to one of the contact pads 531–546 of FIG. 15. The contact pad 806 is contacted by a pogo pin 808 when testing occurs as taught herein. Since the pogo pin is large and pressed against the pad 806 with some force, damage may be caused in the region 803. For this reason, area 803 does not contain any active circuitry which could be damaged by the pressure exerted by the pogo pin 808. FIG. 16 teaches that active circuitry is not placed under the pads 806 or pads 531–546 in some embodiments to avoid active circuitry failure due to pressure. Failure of any device on an IC will most likely render the entire IC inoperable and reduce yield. A reticle contains M×N integrated circuits wherein N and M are independent finite positive integers and the M×N integrated circuits may be referred to as a sub-group of integrated circuits.

Contact holes may also be referred to as vias or contacts. It is to be understood, therefore, that this invention is not limited to the particular forms illustrated and that the appended claims cover all modifications that do not depart from the spirit and scope of this invention.

What is claimed is:

1. A semiconductor wafer comprising:
   a substrate region;
   a plurality of N integrated circuits formed over the substrate wherein the N integrated circuits are separated by scribe lines which isolate one integrated circuit from all other integrated circuits adjacent the one integrated circuit, the N integrated circuits being divided into M sub-groups of integrated circuits wherein N and M are finite positive integers wherein N>M;
   a plurality of L interconnect conductive regions formed overlying the integrated circuits within each of the M sub-groups, L being any finite positive integer, each interconnect conductive region overlying a single sub-group, being isolated from all other interconnect conductive regions which overly adjacent subgroups, and having at least one pad contact area coupled to the plurality of L interconnect conductive regions, the at least one pad contact area directly overlying at least one of the N integrated circuits; and
   wherein the at least one pad contact area lies within a perimeter of the at least one of the N integrated circuits where no active circuitry is positioned directly underneath the pad contact area.

2. The semiconductor wafer of claim 1 wherein the at least one pad contact area lies partially over a scribe line area.

3. The semiconductor wafer of claim 1 wherein each connection between one interconnect conductive region and one sub-group contains a resistor element between the one interconnect conductive region and the one sub-group.

4. The semiconductor wafer of claim 1 wherein the pads are coupled to conductive elements which provide test-related signals to the sub-groups through the plurality of L interconnect conductive regions.

5. A semiconductor wafer comprising:
   a first plurality of integrated circuits arranged over a surface of the wafer in a two-dimensional manner, the integrated circuits containing areas void of active circuitry which are surrounded by active circuitry;
   a first plurality of metallic contact regions directly over a second plurality of the integrated circuits wherein the second plurality of integrated circuits contains a portion of the integrated circuits from the first plurality of integrated circuits and contains fewer integrated circuits than the first plurality of integrated circuits;
   a first plurality of metallic interconnects coupling each metallic contact region of the first plurality of metallic contact regions to each integrated circuit in the second plurality of integrated circuits so that the plurality of metallic contact regions communicates signals to the second plurality of integrated circuits to test the second plurality of integrated circuits while other conductors which are electrically separated from the first plurality of metallic contact regions are used to test any integrated circuits not within the second plurality of integrated circuits; and
   wherein the plurality of metallic contact regions comprise pad regions overlying the areas void of active circuitry.

6. The semiconductor wafer of claim 5 wherein a third plurality of integrated circuits comprises integrated circuits which are both mutually exclusive to all integrated circuits within the second plurality of integrated circuits and selected from the first plurality of integrated circuits, the third plurality of integrated circuits being coupled to a second plurality of metallic interconnects which are physically separated and electrically isolated on the semiconductor wafer from the first plurality of metallic interconnects.

7. The semiconductor wafer of claim 5 wherein a third plurality of integrated circuits comprises integrated circuits which are both mutually exclusive to all integrated circuits within the second plurality of integrated circuits and selected from the first plurality of integrated circuits, the third plurality of integrated circuits being coupled to a second plurality of metallic interconnects which are physically separated and electrically isolated on the semiconductor wafer from the first plurality of metallic interconnects.

8. A semiconductor wafer, comprising:

a semiconductor substrate having an upper major surface;

a plurality of integrated circuit die having an upper surface, said plurality of integrated circuit die being formed on said semiconductor substrate, the integrated circuit die being separated by scribe lines; and a first plurality of wafer conductors, electrically coupled to a first integrated circuit die of the plurality of integrated circuit die, a first plurality of contact regions of the first plurality of wafer conductors being formed overlying the upper surface of the first integrated circuit die, the first plurality of wafers conductors being wired to provide a plurality of signals to the first integrated circuit, the first plurality of contact regions overlying a portion of the substrate that is void of active circuitry and the first plurality of contact regions not overlying any portion of the scribe lines;

a second plurality of wafer conductors, electrically coupled to a second integrated circuit die of the plurality of integrated circuit die, a second plurality of contact regions of the wafer conductor being formed overlying the upper surface of the second integrated circuit die, the second plurality of wafer conductors being wired to provide the same plurality of signals to the second integrated circuit but the first plurality of wafer conductors being disjoined, on the semiconductor wafer, from the second plurality of wafer conductors; and whereby electrical contact can be made to the first one of the plurality of integrated circuit die by way of the wafer conductor for purposes of testing.

9. The semiconductor wafer of claim 8, wherein the semiconductor wafer further comprises:

a first plurality of bond pads formed overlying said semiconductor substrate, said first plurality of bond pads being coupled to said first plurality of wafer conductors through at least two distinct layers of metal.

10. A semiconductor wafer as in claim 8, wherein each of said plurality of integrated circuit die comprises:

a predetermined number of bonding pads formed via a layer of conductive material, the bonding pads being coupled to the first plurality of wafer conductors via at least one contact opening.

11. A semiconductor wafer as in claim 8, wherein the semiconductor wafer further comprises:

a current limiting means having a first terminal coupled to one wafer conductor in the first plurality of wafer conductors and having a second terminal coupled to at least one bonding pad on the first integrated circuit die.

12. A semiconductor wafer as in claim 8, wherein each of said plurality of integrated circuit die is a data processor.

13. A semiconductor wafer as in claim 8, wherein during testing, each data processor executes a plurality of data processor instructions at a temperature above room temperature.

14. A semiconductor wafer as in claim 8, wherein said wafer conductor supplies a signal to said plurality of integrated circuit die, the signal being selected from a group consisting of: a reset signal, a clock signal, a data input signal, a data output signal, and a voltage supply.

* * * * *